US011041788B2

(12) United States Patent
Zandbergen

(10) Patent No.: US 11,041,788 B2
(45) Date of Patent: Jun. 22, 2021

(54) CRYOTRANSFER SYSTEM

(71) Applicant: HennyZ B.V., Katwijk (NL)

(72) Inventor: Hendrik Willem Zandbergen, Katwijk (NL)

(73) Assignee: HennyZ B.V., Katwijk (NL)

( * ) Notice: Subject to any disclaimer, the term of this patent is extended or adjusted under 35 U.S.C. 154(b) by 0 days.

(21) Appl. No.: 16/631,007

(22) PCT Filed: Jul. 12, 2018

(86) PCT No.: PCT/NL2018/050473
§ 371 (c)(1),
(2) Date: Jan. 14, 2020

(87) PCT Pub. No.: WO2019/013633
PCT Pub. Date: Jan. 17, 2019

(65) Prior Publication Data
US 2020/0141846 A1    May 7, 2020

(30) Foreign Application Priority Data

Jul. 14, 2017   (NL) ...................................... 2019247

(51) Int. Cl.
*G01N 1/42*       (2006.01)
*H01J 37/18*      (2006.01)

(52) U.S. Cl.
CPC .............. *G01N 1/42* (2013.01); *H01J 37/185* (2013.01); *H01J 2237/2001* (2013.01); *H01J 2237/2007* (2013.01); *H01J 2237/20207* (2013.01); *H01J 2237/20221* (2013.01); *H01J 2237/2802* (2013.01)

(58) Field of Classification Search
CPC .. G01N 1/42; H01J 37/185; H01J 2237/2001; H01J 2237/2007; H01J 2237/20207; H01J 2237/20221; H01J 2237/2802; H01J 2237/204; H01J 2237/28; H01J 37/20
USPC ......... 250/306, 307, 310, 311, 440.11–443.1
See application file for complete search history.

(56) References Cited

U.S. PATENT DOCUMENTS

| 8,516,909 B2 | 8/2013 | Lihl et al. |
| 2011/0180724 A1 | 7/2011 | Terada et al. |

(Continued)

FOREIGN PATENT DOCUMENTS

| DE | 102014110722 | 2/2016 |
| DE | 102015100727 | 7/2016 |
| WO | WO 2019/013633 | 1/2019 |

OTHER PUBLICATIONS

International Search Report and the Written Opinion dated Oct. 11, 2018 From the International Searching Authority Re. Application No. PCT/NL2018/050473. (21 Pages).

(Continued)

*Primary Examiner* — Michael Maskell

(57) ABSTRACT

The present invention is in the field of a cryo transfer system for use in microscopy, and a microscope comprising said system. The present invention is in the field of microscopy, specifically in the field of electron and focused ion beam microscopy (EM and FIB), and in particular Transmission Electron Microscopy (TEM). However its application is extendable in principle to any field of microscopy, especially wherein a specimen (or sample) is cooled or needs cooling.

15 Claims, 14 Drawing Sheets

(56) References Cited

U.S. PATENT DOCUMENTS

2015/0137000 A1* 5/2015 Naruse .................... H01J 37/20
250/441.11
2016/0276126 A1 9/2016 Zandbergen

OTHER PUBLICATIONS

He et al. "Cryo-FIB Specimen Preparation for Use in a Cartridge-Type Cryo-TEM", Journal of Structural Biology, XP085134669, 199(2): 114-119, Available Online May 27, 2017.
Leica Microsystems "Leica EM VCT100 Vacuum Cryo Transfer: From Preparation to Analysis", Leica Microsystems GmbH, XP055462195, p. 1-12, May 2009.
Tacke et al. "A Versatile High-Vacuum Cryo-Transfer System for Cryo-Microscopy and Analytics", Biophysical Journal, XP029441560, 110(4): 758-765, Feb. 23, 2016.
Tacke et al. "A Versatile High-Vacuum Cryo-Transfer System for Cryo-Microscopy and Analytics", Biophysical Journal, XP055461992, Supplemental Information, 110: 1-5, Feb. 23, 2016.

\* cited by examiner

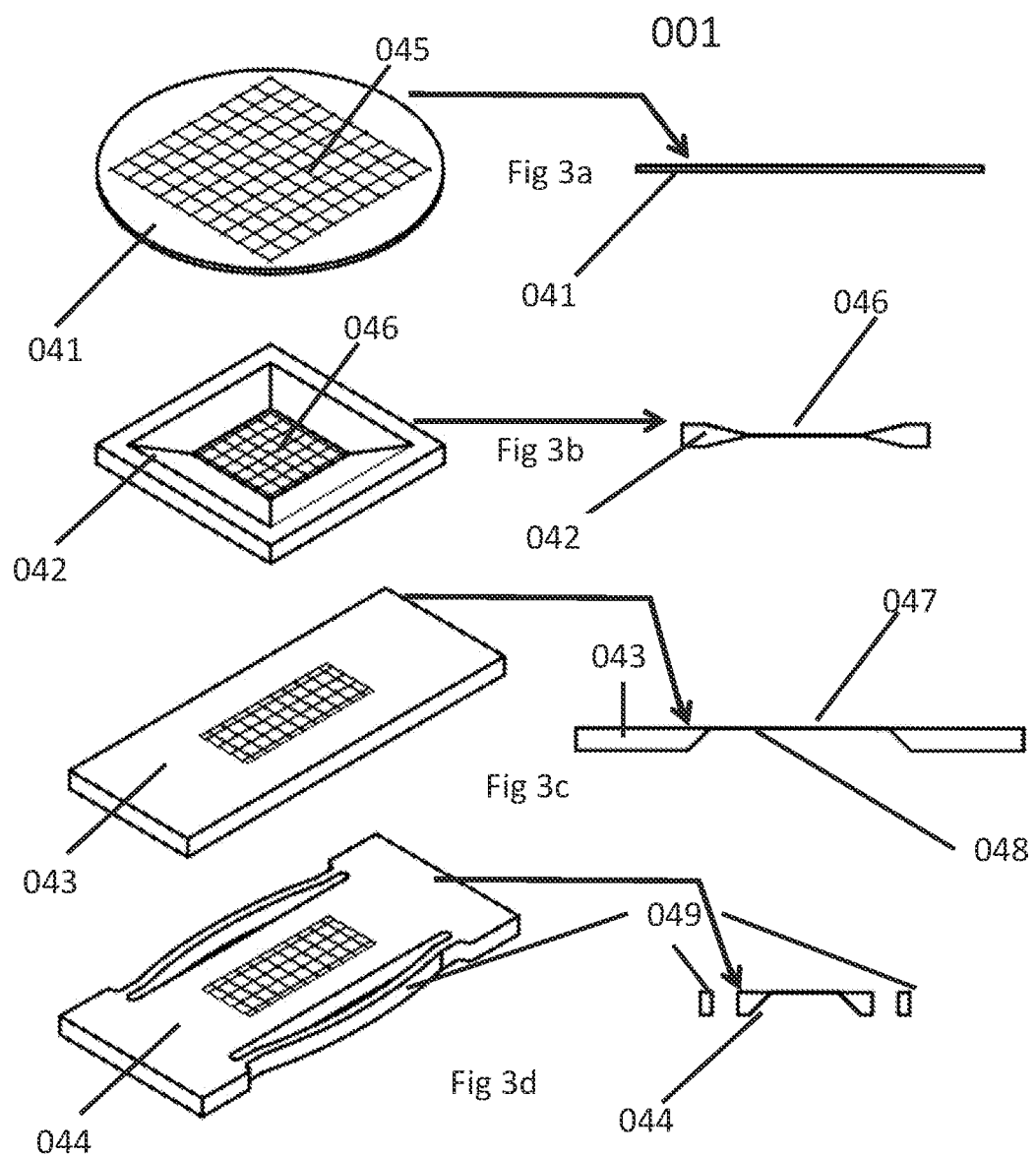

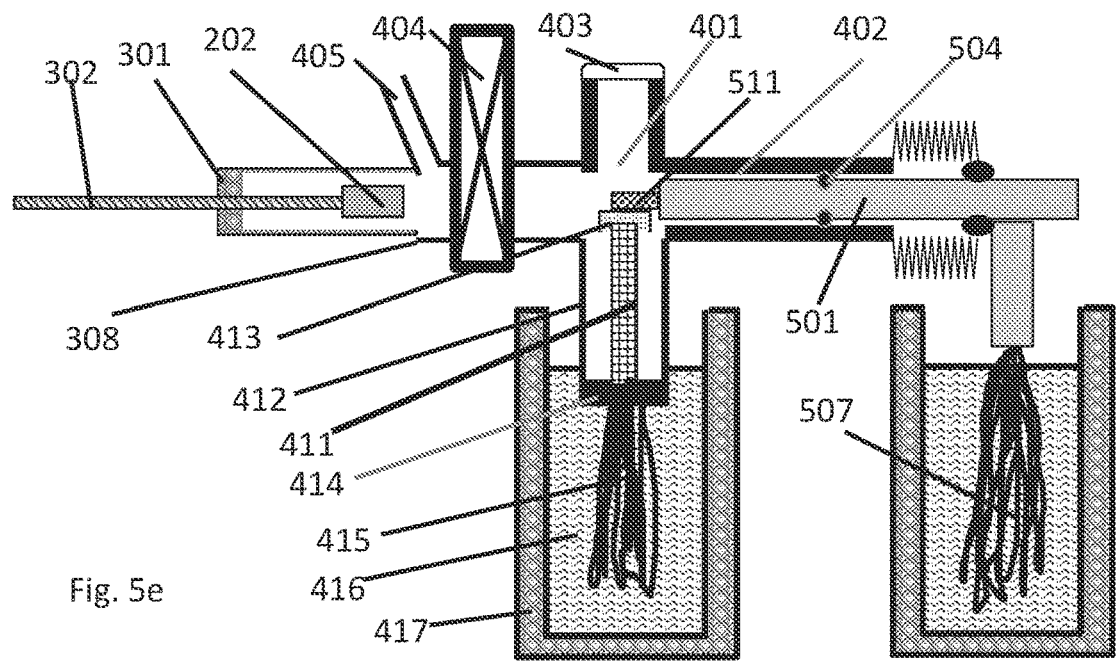
Fig. 5e
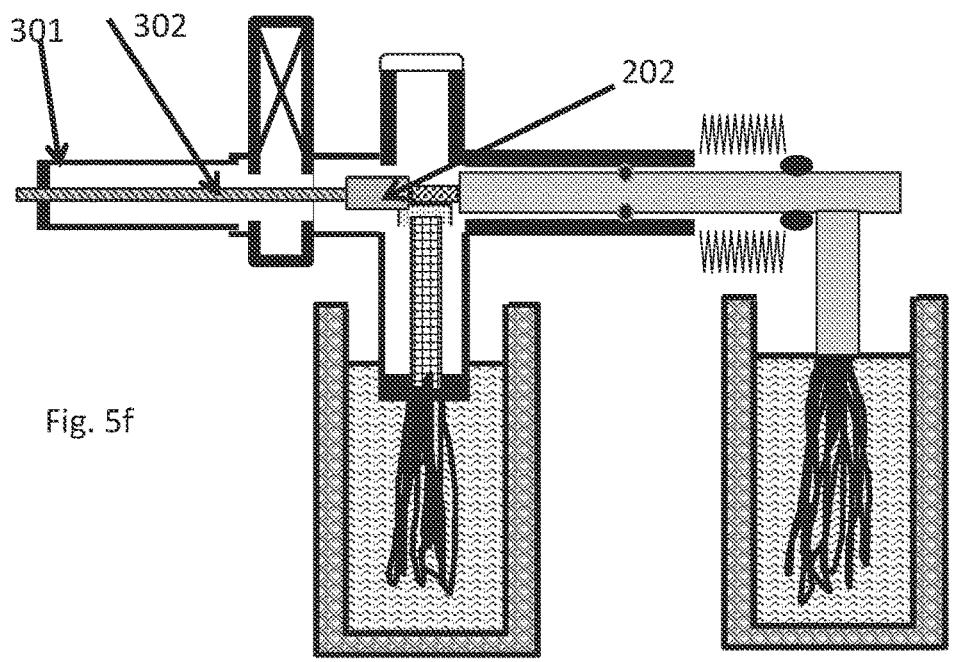
Fig. 5f
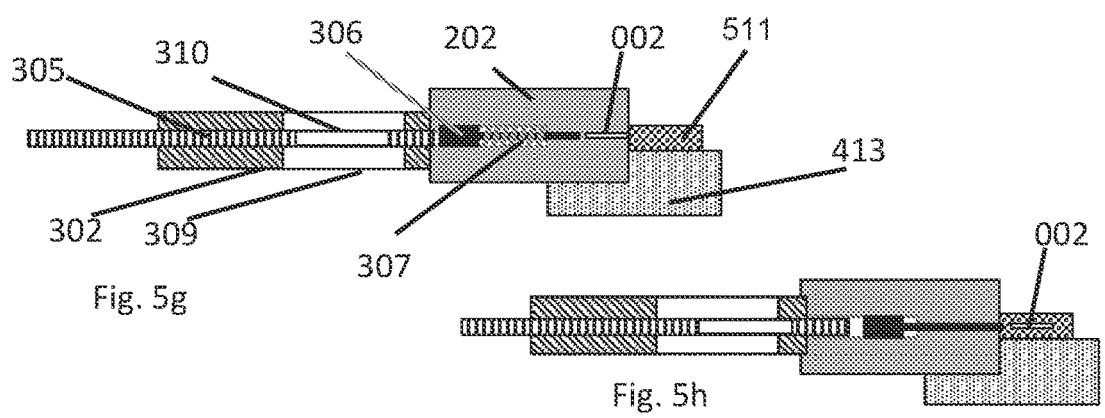
Fig. 5g
Fig. 5h

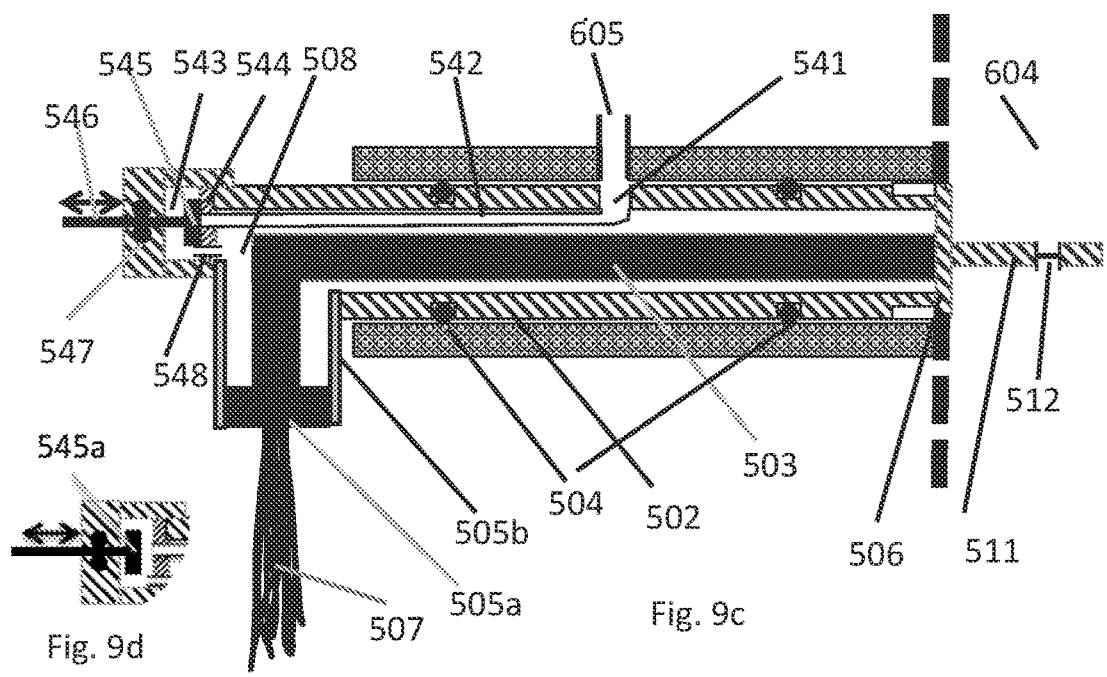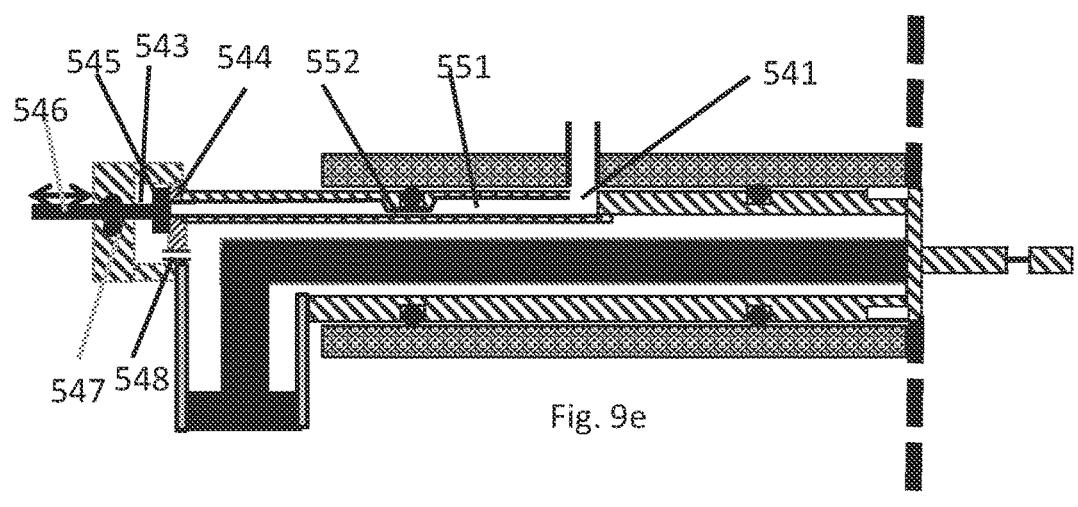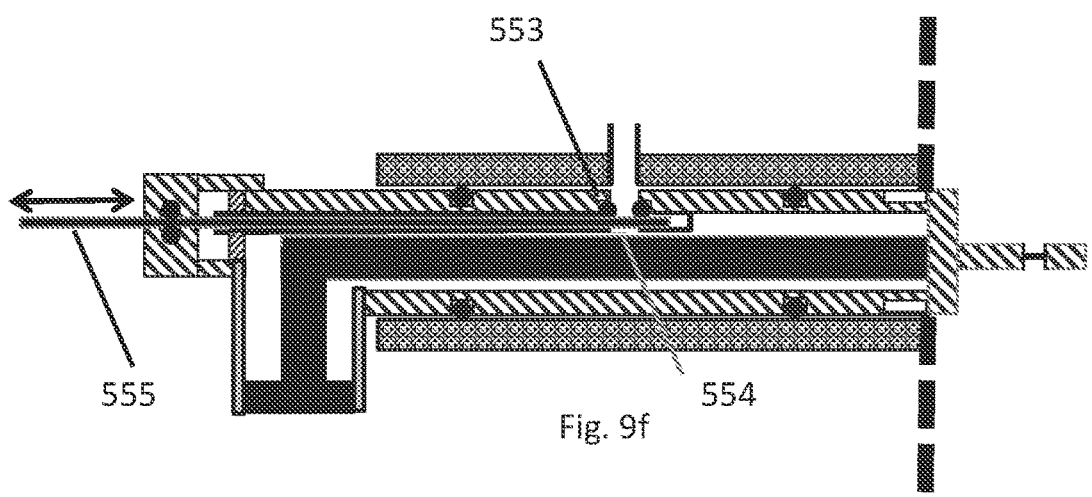

CRYOTRANSFER SYSTEM

FIELD OF THE INVENTION

The present invention is in the field of a cryo transfer system for use in microscopy, and a microscope comprising said system.

BACKGROUND OF THE INVENTION

The present invention is in the field of microscopy, specifically in the field of electron and focused ion beam microscopy (EM and FIB), and in particular Transmission Electron Microscopy (TEM). However its application is extendable in principle to any field of microscopy, especially wherein a specimen (or sample) is cooled or needs cooling.

Microscopy is a technique often used in scientific research. It is widely used in life sciences to obtain information in the 0.1 nm to 1 μm resolution domain. In microscopy typically a source is used to obtain an image. The source may be light, electrons, or ions. Under optimal conditions a modern microscope can image a sample with a spot size typically in the order of a few tenth of nanometers for a TEM, a nanometer for a FIB and Scanning (S)EM, and a few hundred nanometers for an optical microscope.

In order to form images of the sample at a location of choice thereof (the sample typically is much larger than an image being formed) and/or at a different orientation, such as under an acute angle, a manipulation device, such as a goniometer, is typically provided in the microscope.

Electron and ion beam microscopes are typically optimized for use at ambient temperature. The microscope and elements of the microscope are therefore preferably substantially at a same temperature. With e.g. a transmission electron microscope a resolution of about 0.1 nm can then be achieved. A sample is typically placed into a holder that—once the sample is placed—is inserted in the microscope. Typically an image is formed in one millisecond to about a second.

Samples may need to be cooled to e.g. about liquid nitrogen temperature, also referred to as "cryo", which typically is the case for biological samples. Prior art systems in which a complete cryotransfer system integrated in a dedicated TEM are used are typically expensive whereas specific cryo-transfer holders that can be inserted in other TEMs are very user-unfriendly and still allow for specimen degradation due to ice formation on the sample.

In cryo-electron microscopy one typically has to insert a previously (quenched) frozen sample into a cryo-sample holder while the sample is kept below 120 K and preferably below 100 K. This insertion process is called cryo-transfer. This low temperature is needed to prevent that water in the specimen will change its morphology from amorphous ice to crystalline ice. For the remainder of this description a temperature of <100 K is used to indicate that at the sample always has to be at a temperature well below the transformation temperature, which is about 130 K. Prior to the cryo-transfer, the cryo-sample is prepared to form thin electron transparent areas by plunge freezing or by cryo-ultramicrotomy. After this sample preparation, samples may be stored in a cryocontainer at <100 K.

As mentioned above during the cryo-transfer of the sample from the cryo-container into the cryo-sample holder of the microscope, the cryo-container in which the cryo-sample is stored, the receiving tip of the cryo-sample holder, as well as the sample itself, have to be kept at <100 K all the time. Also during transfer into the (transmission) electron microscope (TEM) and during the time it is in the TEM, the sample has to be at <100K.

An extremely important issue is prevention of deposition of water/ice on the sample. In order to prevent deposition it is typically required that, when the sample is exposed to an environmental atmosphere, this atmosphere should have an as low as possible partial water pressure; in an alternative the sample is covered completely such as by a cryo shield that is intended to collect all water molecules travelling in the direction of the sample.

In a prior art procedure (see FIG. 1 bottom) the sample transfer is done by loading the cryo-container 101 in a fully automated system (autoloader) 961, which loads under full cryo conditions the cryo-sample into a cryo-sample holder that is permanently positioned on the transmission electron microscope TEM 951. This TEM has a holder 953 that is permanently fixed in the goniometer 952. This is, however, an expensive working procedure and requires a dedicated electron microscope.

In another prior art procedure (see FIG. 1 top) the cryo-transfer from cryo-container 101 to cryo-sample holder 911 is done by keeping the sample within a bath of liquid nitrogen 903 or under cold nitrogen gas inside a Dewar 901 and loading 942 the sample in a cryotransfer holder of which the tip 912 is also placed in the cold nitrogen gas just above the liquid nitrogen. This is done manually and during this manual operation one has to keep the sample at <100 K continuously. Manual operation under these conditions is rather tedious. In a prior art manual cryotransfer system the sample is taken out of the cryocontainer with tweezers after which it has to be rotated over 90° to allow placing it in the sample recess in the cryo-sample. Subsequently a researcher has to place a screw in the recess and turn it with a dedicated screw driver to fix the sample into the recess. As this is a time consuming process one often has to take extra measures such as use of a transparent cover over the Dewar with small holes for the two tweezers, to reduce the ice formation on the sample. This cover makes the loading of the sample even more difficult.

A prior art cryotransfer holder for the above procedure typically consists of a holder with a Dewar 913 on the part of the holder that is positioned on the outside of the electron microscope. This Dewar is connected to the tip by a cooling rod, which transports "coldness" to the tip of the rod. Only one cryosample can be loaded in the holder and given that the cryoloading of this holder takes 30 to 60 minutes and the thermal equilibration of the holder after insertion into the TEM another 30-60 minutes, fast screening of a series of cryosamples is not possible or at least very time consuming. To reduce the coldness flux from the cooling rod to outside parts of the holder a good vacuum inside the holder is typically required, as outside parts are at room temperature (about 20° C.). In prior art cooling holders, a small valve 923 is typically located near the Dewar and before use of the holder for cryotransfer, the holder has to be vacuum pumped through this valve. This pumping takes typically several hours. The valve is small to keep the weight of the holder within an acceptable limit, and therefore the pumping speed being limited by the valve size is low as well. Typically the holder can be used for several hours before it has to be pumped again. In general this is not a serious limitation because typically only one sample can be loaded and investigated before a new complete cryo transfer has to be done. A disadvantage of this method is that once the holder is located inside of a TEM 931, one typically cannot pump because of the vibrations caused by pumping in combination with the location of the valve (on the end of the holder and thus very vibration sensitive). Possibly more important a mechanical connection of the holder to a further element for pumping the inside of the holder could damage the goniometer 932, which is a very expensive part of an electron microscope.

An important disadvantage of the above prior art cryo sample loading is that the tip of the holder is (apart from the cooling by liquid nitrogen in the dewar on the holder) strongly cooled by the metal block 904 that supports the holder tip and is partly in liquid nitrogen. It is essential that this support exists because the loading of the cryo sample into the tip 912 requires some support during sample loading and some extra cooling is needed to keep the tip <100 K during loading and helps to keep the temperature at <100 K transfer into the TEM. The temperature of the outside tube of the holder is therewith well below freezing point. During transport to the TEM ice formation on the outside tube occurs, thereby contaminating the TEM. On top of this, an O-ring 915 in the tube can become so cold that it loses its flexibility resulting in leakage over the O-ring when it is inserted in the TEM, which can even result in a breakdown of the vacuum. Another important disadvantage of the holder that is used above is that the dewar used to cool the tip of the holder has a fixed position with respect to the pin of the holder that is used to open the valve in the goniometer; to open this valve the holder is loaded in the goniometer in an orientation of about 90° from the orientation at with the TEM imaging is done. In this orientation, most liquid nitrogen 914 will flow out of the dewar connected to the holder. Since the holder has to be kept in this orientation for quite a while to pump away the ice on the outside tube, one typically rotates the goniometer 932 (an α tilt) such that the dewar keeps enough nitrogen. However, prior to the full insertion of the holder (requiring a rotation of the holder) the goniometer has to set at α=0 to prevent damage of the goniometer or the objective lens during insertion. Two other serious disadvantages of the prior art cryo transfer holder with a dewar on the holder are that a) a resolution loss occurs due to vibrations and b) a relatively large specimen drift due to a thermally not stable system.

Tacke in Biophysical Journal, Elsevier, Vol. 110, No. 4, p. 758-765 (Feb. 23, 2016) recites high vacuum cryotransfer system. However at least one transfer step is done at ambient pressure, which can result in ice formation on the sample as can be seen in FIG. 1g (supplementary information). Also it has a prior manner of sample loading requiring tedious manual operations (including grid rotation).

DE 102015 100727 A1 recites a removable vacuum cryotransfer system.

Both the above systems are not directly suited for transfer into the vacuum chamber of a microscope.

DE 10 2014 110722 A1 recites a cryo loading station comprising a chamber, which is at ambient pressure, adapted to be connected to a conventional cryotransfer TEM holder and a sample transfer rod to bring a sample into the chamber under cryo conditions. The chamber is however not well suited for protection against environmental conditions since it is a chamber that is open on the top. Also is uses the conventional manner of sample loading requiring tedious manual operations.

Each of the three above systems are not directly suited for user-friendly and reliable transfer of cryosamples into the vacuum chamber of a microscope.

The present invention therefore relates to a cryo transfer system for use in (combination with) microscopy, and a microscope comprising said system, which solve one or more of the above problems and drawbacks of the prior art, providing reliable results, without jeopardizing functionality and advantages.

SUMMARY OF THE INVENTION

The present invention relates to a removable cryotransfer system according to claim 1, and as such can be transported from one location, e.g. of loading or preparing a sample, to a second location, e.g. a microscope. The cryotransfer system 1000 comprises a cartridge 002, a cartridge block 202, a cartridge block transporter 301, a cryo vacuum transfer chamber 401 with an aligner 413 provided inside tube 402 and arranged for receiving the cartridge block thereon, in order to position the cartridge into the tip of the microscope sample holder 501, and a sample holder 501 (further referred to as Cryo+ sample holder) to receive the cartridge with a tip 511 and optionally a dock 515 and a removable protection 561 against ice deposition, preferably an extendable protection. The cartridge 002 (see FIG. 4) comprises at least one recess 003 for holding a sample carrier (see FIG. 3), at least one slit 007 providing with respect to the cartridge parallel loading of the sample carrier preferably at <100K and optionally in vacuum, the sample carrier being provided on a support in the recess 003, and a fixing element 004; the cartridge block (see FIG. 7) typically comprises space(s) 205 for positioning of cartridge(s), and typically cartridge block slits 203 that are aligned with the slits of the cartridge(s), an aligning element that allows placing the cartridge block well defined on the cryo-aligner of the cryo vacuum transfer chamber and optionally an element that allows pushing out of the cartridge to place it in Cryo+ sample holder and optionally a displacer that moves a cartridge in line with the receiving space in Cryo+ sample holder; the cartridge block transporter 301 (see FIG. 5c) comprises a cartridge block mover 302, and a cartridge connector 303, and preferably at least one of an O-ring 304, a cartridge mover 305, a pushing aid 306, a fastener 307, and a vacuum coupler 308, whereby the cartridge block mover and the cartridge mover may have at least one low thermal conductivity part to ensure that the O-ring 304 does not become too cold; the cryo transfer chamber 401 (see FIG. 4e) comprises a tube 402 for receiving the Cryo+ sample holder, a valve 404, and a cryo-aligner 413, and optionally at least one of a viewing window 403, a vacuum pump connector 405, a further valve 406, a cooling element, wherein the cooling element preferably comprises a cooling rod 411, a thin-walled tube 412, a vacuum tight connector 414 that is suited for cryogenic application, and a metal braid 415, typically being in thermal contact with a cooling liquid 416 to keep the aligner at a low temperature of e.g. <100 K, on which the cartridge block can be docked; the cryo-aligner may receive more than one cartridge block; and a Cryo+ sample holder 501 (see FIG. 9 c-g) with a tip 511 and optionally at least one of a cooling rod 503, an O-ring 504,504a, a connector 505,506, a cooling element 507 in operation adapted to maintain the sample in thermal contact with the cooling rod 503 and the tip 511 to keep the sample at a temperature of <100K, a protection 561, preferably an extendable protection, a counter grip 513 (see FIG. 8), and a dock 515 (see FIG. 8a). Also a cartridge storage rack (see FIG. 10) 623 and sensors for monitoring and maintaining a height of liquid nitrogen in a Dewar may be provided, such as two sensors (see FIG. 5n) placed at a distance of about 1 cm, being coupled to a liquid nitrogen supply for adjusting a liquid nitrogen level. The present system provides easy move-up move down loading (see FIG. 6) of a sample (such as on a grid) into the cartridge, which loading can be performed by a robot; all steps that are critical in preventing ice formation on the sample can be performed under vacuum and under cryo-conditions with the present system; the present cartridge can comprise multiple samples (see FIG. 4*b-d* and FIG. 4*f*) 002*b*, 002*c*, 002*d* and 011; If a cartridge contains several specimens and in particular if more cartridges are stored in the Cryo+ sample holder long investigation times (10-100 hours) can be realised because the sample(s) can be moved easily in the Cryo+ sample holder, such as by repositioning the cartridge therein; a good vacuum can be maintained in the Cryo+ sample holder, such as by a closable connection 542, 551-552 (see FIG. 9 *c-f*) to the (intermediate) vacuum being available in the (electron) microscope; the present samples can be stored under vacuum and cryo conditions, being ready for use.

For convenience of the reader a table with reference numerals is incorporated below.

By providing the present system, cryo EM, as on biological samples, is now much easier and cheaper, especially for more samples being loaded at once. It is noted that dedicated systems may be available for this purpose, but these systems are complex, expensive, involve further specific elements, etc. The present Cryo+ sample holder can be fitted in a conventional (life or material) science TEM. In particular materials science TEMs are often equipped with optical components that are superior to those of life sciences, and in particular the availability of many materials science TEMs with an aberration corrector will be important for further improvement of the information limits in life science imaging. The present image resolution is better than 0.2 nm, which is required for biological samples, and also better than 0.1 nm, which is required for material science samples.

With the present system a multitude of images, such as $10^5$ images, can be obtained in an automated fashion. The images can be analysed and/or selected after being obtained. In addition a multitude of samples can be imaged, e.g. sequentially. As such the present system may for instance be used for single particle analysis. In an example thereof a purified substance, such as a protein, is provided on a sample carrier, typically a thin Cu grid with an ultrathin film of carbon or graphene. The multitude of images provides accurate information, typically after processing images, of 2D and 3D structure of the substance. Typically a low dose beam is used for such applications. For single particle recording no significant tilt is required. For tomographic cryo TEM one typically requires a large tilt over which many images of the sample object are taken. Thus in the latter case the holder is preferably very thin, like 0.4 mm as in 002*a*-002*d*, to have the largest tilt range and thus thin cartridges. For single particle cryo TEM the cartridge can be a lot thicker as in 011 and 021, like 1 mm.

The holder can be equipped with an automatic rotation (see FIG. 11) of part of the TEM holder that is positioned outside of the goniometer, such that the cooling braid 507 of the holder is always in a vertical orientation even during loading of the TEM holder in the goniometer which requires rotation of the holder part that extends in the goniometer over 90° or more. A sensor on the rotatable part of the holder can sense that it is not vertical and it is repositioned by a motor that rotates the rotatable part such that a vertical orientation is again obtained. This correction can be done typically in 0.1 s, such that the rotation of the holder during insertion into the goniometer can be followed by a counter rotation of the rotatable part of the holder. To ensure a good thermal connection between the cooling rod and the cooling braid that is sufficiently flexible to allow rotation over at least 180° and does not lead to significant loss of coldness flow into the cooling rod a thick coiled Litze wire 532 is provided, in which the coil axis the almost equal to the holder axis.

The present Cryo+ sample holder is suited for advanced science research, e.g. at cryogenic conditions.

The present invention also relates to an improved microscope comprising the present system.

Thereby the present invention provides a solution to one or more of the above mentioned problems and drawbacks.

Advantages of the present description are detailed throughout the description.

DETAILED DESCRIPTION OF THE INVENTION

The present invention relates in a first aspect to a cryo transfer system according to claim 1.

In an exemplary embodiment of the present cryotransfer system the cartridge 002 comprises at least one of a clamp 004*a* for clamping the sample carrier 001 in the cartridge, and a grip 008. The clamp may be in the form of a metal bridge providing sufficient force on the sample carrier to secure a good thermal contact to the cartridge. The grip may have a hollow portion having two extensions opposite of one and another and a larger inner hollow part, e.g. in the form of an Ω for receiving a lob-like structure, and vice versa.

In an exemplary embodiment of the present cryotransfer system the cartridge 002 comprises an array of n*m recesses, such as wherein n∈[2-10] and m∈[1-10], such as 2-10 recesses, such as 3-5 recesses.

In an exemplary embodiment of the present cryotransfer system the recess 003 in the cartridge 002 has a shape selected from circular, ellipsoidal, hexagonal, square, and rectangular.

In an exemplary embodiment of the present cryotransfer system the fixing element 004 for the sample carrier in the cartridge is a spring or a clasp 012 optionally with a slider 014. Therewith the sample carrier is securely fixed for use in a microscope.

In an exemplary embodiment of the present cryotransfer system the cartridge 002 has an external shape adapted to an internal shape of the receiving dock, such as a tapered shape.

In an exemplary embodiment of the present cryotransfer system the cartridge block 202 comprises at least one of a sample receiving slit 203 providing easy and guided access for a sample, a press 204 for securing the cartridge, preferably a rotatable press, a cartridge receiving slit 205 for providing easy access to a cartridge and an aligning element.

In an exemplary embodiment of the present cryotransfer system the cartridge block 202 comprises a mechanism to push out the cartridge into the tip of the sample holder 511. In an exemplary embodiment of the present cryotransfer system the CBT comprises a click-on element 303 for holding the cartridge block.

In an exemplary embodiment of the present cryotransfer system the CBT comprises a tool, such as a rod, to push out the cartridge from the cartridge block into the tip in the holder.

In an exemplary embodiment of the present cryotransfer system the aligner comprises at least one cartridge block guiding element, such as in the form of a lob-like structure. It is noted that a shape of the aligner cartridge guiding element and guiding element of the cartridge fit to one and another and in terms of shape are mutually exchangeable.

In an exemplary embodiment of the present cryotransfer system the cartridge block comprises a cartridge-stacking element for placing cartridges.

In an exemplary embodiment of the present cryotransfer system the aligner comprises a tool to allow sequential loading of placing 2-10 cartridges, such as 3-5 cartridges in the tip 511 of the Cryo+ sample holder 501. In an example a first cartridge is moved aside, and a second cartridge is moved in the place of the first cartridge.

In an exemplary embodiment of the present cryotransfer system the aligner 413 is fixed to the cooling element of the cryo vacuum transfer chamber, such as fixed to a finger (411+412+414+415) of the cryo vacuum transfer chamber 401.

In an exemplary embodiment of the present cryotransfer system the Cryo+ sample holder 501 comprises a vacuum system, the vacuum system comprising an opening 541, a connection 542,551,552, a space 543, a wall 544 with an opening, a movable stop 545, a slider 546 for moving the stop, an O-ring 547, and a further opening 543 connecting an interior of the holder 508 with space 543.

In an exemplary embodiment of the present cryotransfer system the Cryo+ sample holder 501 comprises a cartridge storage rack 521, and at least one of a cartridge storage rack mover 522, a guider 523, a translator driver 524, a translator 525 for moving the cartridge in a longitudinal direction, and a housing 527 for the translator. The translator may be part of the receiving dock, part of the Cryo+ sample holder, or a combined part of the dock and Cryo+ sample holder. With the translator 525 a cartridge can move such that a next sample is exposed to an electron or ion beam.

In a second aspect the present invention relates to a cartridge 002 for a cryotransfer system 1000 according to the invention, comprising at least one recess 003 for holding a cryo-sample, at least one slit 007 providing with respect to the cartridge parallel loading of the sample carrier, and a fixing element 004.

In a third aspect the present invention relates to a cartridge block for a cryo transfer system 1, comprising at least one of a sample receiving slit 203, a press 204, preferably a rotatable press, a cartridge receiving slit 205.

More cartridges can be incorporated in the cartridge block and they can be inserted into the Cryo+ sample holder by making a stack of cartridges and separators, which are pressed to the location of the first cartridge and whereby after loading the first cartridge into the Cryo+ sample holder the first separator is removed in a direction perpendicular to the cartridge loading direction and the stack direction, after which the second cartridge is in the location of the first one.

In a fourth aspect the present invention relates to a cartridge block transporter CBT 301 for a cryotransfer system 1000 according to the invention, comprising a cartridge mover 302, and a cartridge connector 303, and preferably at least one of an O-ring 304, a cartridge mover 305, a pushing aid 306, a fastener 307, and a vacuum coupler 308. Typically the fastener 307 and the pushing aid 306 are, in an alternative approach, provided in the cartridge block (as items therein)

In a fifth aspect the present invention relates to a cryo vacuum transfer chamber 401 for a cryo transfer system comprising a tube 402 adapted to receive a microscope sample holder (501), a valve 404 arranged to receive the cartridge block transporter (301), a connection to a high vacuum pump, and an aligner 413 provided inside tube 402 and arranged for receiving the cartridge block thereon in order to position the cartridge into the tip of the microscope sample holder 501, and optionally at least one of a viewing window 403, a vacuum pump connector 405, a further valve 406, a cooling element connected to the aligner (413) in operation in thermal contact with a cooling liquid (416) to keep the aligner at a temperature of <100K, wherein the cooling element preferably comprises a cooling rod 411, a tube 412, a vacuum-tight connector 414, and a metal braid 415.

In a sixth aspect the present invention relates a Cryo+ sample holder for a cryo transfer system 1000 comprising a tip 511 and optionally at least one of a cooling rod 503, an O-ring 504,504*a*, a connector 505,506, a cooling element 507 in operation adapted to maintain the sample in thermal contact with the cooling rod 503 and the tip 511 to keep the sample at a temperature of <100K, a foldable protection 561, a counter grip 513, and a dock 515.

In a seventh aspect the present invention relates to a microscope comprising at least one of a cryo transfer system according to the invention, a cartridge according to the invention, a cartridge transporter according to the invention, and an aligner according to the invention.

In an exemplary embodiment of the present microscope the microscope is selected from a TEM, a SEM, and a FIB.

The one or more of the above examples and embodiments may be combined, falling within the scope of the invention.

Examples

In the invention the sample carrier can be placed without any rotation of the sample carrier into a narrow slit in a cartridge, which already has a preloaded spring or other clamping mechanism to secure the sample carrier, once it is placed in the sample recess for the sample carrier. The cartridge can contain only one position for a sample carrier or several positions. Also the slits can be made such that rectangular sample carriers or sample carriers that are short in at least one direction can be loaded such as with the objective that the number of sample carriers for a given length of the cartridge can be increased. This whole procedure can be performed at a low temperature of <100K such as in a Dewar. Preferably the loading of the cartridge is done in a glovebox ensuring a low water partial pressure or in a cryo-vacuum box.

The cartridge is enclosed by a cartridge block during the loading of the sample carrier or sample carriers. This cartridge block also contain the tools to press the spring into a position such that it secures the sample carrier.

After this sample carrier loading the cartridge block is taken out of the Dewar and connected quickly to a vacuum system (vacuum-cryoloader) which allows for a cryotransfer of the cartridge into the Cryo+ sample holder.

Since cryotransfer into the Cryo+ sample holder is done in vacuum, there will be no detrimental ice formation on Cryo+ sample holder, which on the contrary is frequently the case in the existing method of loading the cryosample with a prior art procedure and therefore the loading into the Cryo+ sample holder needs no rush.

Also the tip part of the Cryo+ sample holder is in vacuum in the same manner as in a TEM. And thus the tip can be kept at <100 K provided that inside the holder there is a good vacuum to prevent too much heat transfer from the outside of the holder to the cooling rod that is inside the holder. Preferably the outside tube of the Cryo+ sample holder contains a temperature sensor and a heater to regulate the temperature of the outside tube to about 20° C. and once the holder is placed in the goniometer of the TEM to the ambient temperature of the goniometer (e.g. 23° C.). This allows to keep the temperature of the outside tube to the goniometer temperature with a fluctuation of less than 0.1 K, which is essential for realising a low specimen drift during the image recording. Preferably the cooling of the sample is realised by the use of a braid that is submerged in liquid nitrogen. The use of such a braid instead of a Dewar on the TEM holder allows for much better resolution and it allows for a simple measure to keep the cooling system always in the same orientation with respect to the optical axis of the microscope (see FIG. 11).

The tip of Cryo+ sample holder is preferably thin (such as 1-5 mm, e.g. 1.5 mm) in the electron beam direction. This provides amongst others a larger tilt about the axis of the Cryo+ sample holder in between the two pieces of the objective lens. The three directions of the Cryo+ sample holder can be defined as x=the holder axis, z is the direction in which it is thin (thus the e-beam direction for a non-rotated position) and the y direction perpendicular to the x and z direction. The cartridge is placed in this thin part preferably by a one direction movement. This can be done either along the Cryo+ sample holder axis (along x) or along the y direction. This can be done relatively easy by the use of a slit in which the cartridge fits the cartridge is fastened by a spring in the cartridge or in the tip or in both.

If the cartridge contains multiple samples the cartridge has to be loaded along the x direction and also a driver is provided in the Cryo+ sample holder to move the cartridge along the x direction to position a certain sample in the electron beam position. If the tip has to be narrow along the z direction, the loading of the cartridge is best done by bringing the driver to the far end of the tip of the Cryo+ sample holder and next click the end of the cartridge with a specific shape onto the driver with the counterpart shape and next pull the cartridge into the tip of the holder. If the tip is thicker in the z direction another click-on system may be used. It is advantageous to have a narrow space between the cartridge(s) and the channel to ensure that as little as possible water molecules are deposited on the cryo sample.

For the Cryo+ sample holder it is important that the interior of Cryo+ sample holder (that contains a metal (Cu) cooling rod at <100 K) is under a vacuum of preferably <$1.10^{-4}$ Torr. Since the vacuum in the TEM and the vacuum-cryoloader is much lower than $1.10^{-4}$ Torr, the pumping system of the TEM and the vacuum-cryoloader can be used to realise said pressure and keep the required vacuum. By addition of a simple valve in Cryo+ sample holder, the area inside the holder can be closed, such that only during transfer of the holder from the vacuum cryoloader to the TEM or vice versa, the vacuum of the inside of the holder is not broken. This type of maintaining the vacuum inside the Cryo+ sample holder has as advantages over prior art systems.

Exemplary Sequence of Actions for Cryoloading

Before starting the loading procedure the Cryo+ sample holder with the extendable protection is inserted in the vacuum cryo transfer chamber (CVTC), the CVTC is brought at a good vacuum (<$1.10^{-6}$ Torr), the tip of the Cryo+ sample holder is cooled with liquid nitrogen and the heater of the outside tube is set at 20° C. and the aligner (RD) is cooled with liquid nitrogen. Also the cartridge block should be loaded with cartridges with pre-loaded springs.

The following steps can be performed. The numbering applied is only to illustrate different steps and does not necessarily reflect an order.

1. Cool down the Dewar with the support for the cryocontainer (CC) and the cartridge block (CB) to liquid nitrogen temperature.
2. Place the CB with a cartridge in it in the support and wait till it is at about liquid nitrogen temperature (no strong boiling observed). Note the CB has to contain part(s) to press the spring in place.
3. Place the CC in the support.
4. Wait a couple of minutes and check the height of the liquid nitrogen. It should be lower than the position of the cartridge in the CB.
5. Take a sample carrier from the CC with a tweezers. Make sure the tip of the tweezers is at liquid nitrogen temperature.
6. Place the sample carrier in the slit in the cartridge block under which the cartridge is positioned with an alignment of the slits of the CB and the cartridge.
7. Press with the tool in the CB the spring onto the sample carrier to secure the sample carrier. If the sample carrier in too loose this could lead to resolution loss or/and a less cold sample.
8. Rotate the CB to the pick-up position.
9. Pick up the CB from the Dewar with the CB transfer unit (CBT), retract it well within the CBT to minimize ice formation on the CB and connect the CBT quickly in the vacuum cryo transfer chamber (CVTC).
10. Pump the CBT with vacuum pump.
11. After about 1 minute close valve to vacuum pump and open valve to CVTC.
12. Place the CB on the Cryo-Aligner (CA) such that it re-mains cold.
13. When vacuum is $1.10^{-5}$ Torr or less start with the loading of the cartridge into the Cryo+ sample holder.
14. Press the cartridge out of the CB with the cartridge mover into the Cryo+ sample holder, using visual checks on the position of the cartridge through the two windows of the CVTC.
15. Once cartridge is in the Cryo+ sample holder, pull back the cartridge mover.
16. Close the valve on the Cryo+ sample holder that connects the vacuum in the CVTC with the inside area of the cryo-transfer holder.
17. Vent the CVTC with nitrogen (preferably dry).
18. Draw back the Cryo+ sample holder from the CVTC slowly allowing the extendable protection to be filled with nitrogen gas.
19. Close the valve 406
20. Rotate the Cryo+ sample holder to the orientation that is can be inserted in goniometer without any additional rotation around the x axis of the holder
21. Close the end of the extendable protection.
22. Place Cryo+ sample holder with the extendable protection as quickly as possible in front of the airlock of the TEM.
23. Remove the cover over the extendable protection.
24. Place Cryo+ sample holder in the airlock
25. If pressure in the airlock is below $5.10^{-4}$ Torr open the valve on the Cryo+ sample holder
26. Wait until the pressure in the airlock is OK for the TEM and then fully insert the Cryo+ sample holder into the TEM. Note: the opening of the airlock on the Cryo+ sample holder could also be done once the sample is fully into the TEM.

The invention is further detailed by the accompanying figures, which are exemplary and explanatory of nature and are not limiting the scope of the invention. To the person skilled in the art it may be clear that many variants, being obvious or not, may be conceivable falling within the scope of protection, defined by the present claims.

FIGURES

The invention although described in detailed explanatory context may be best understood in conjunction with the accompanying figures.

FIGS. 2-11 show exemplary details of the present cryotransfer system and use thereof.

DETAILED DESCRIPTION OF THE FIGURES

Figure 1:
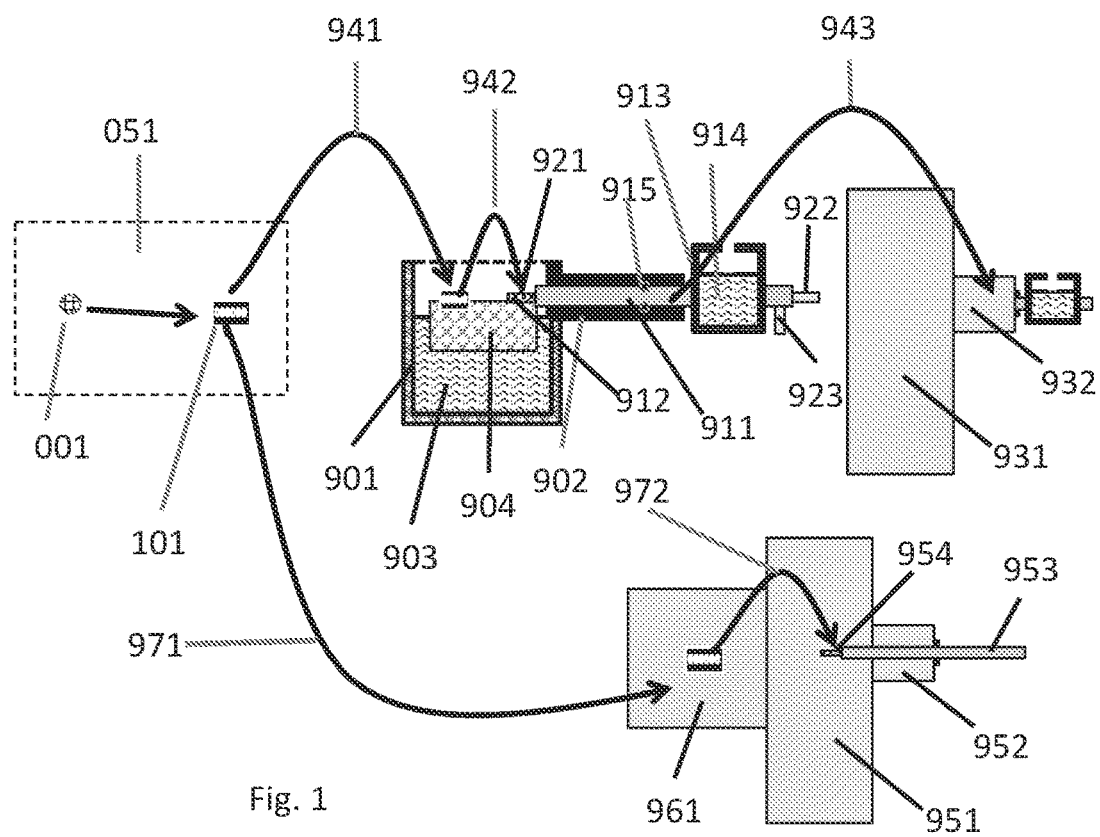
FIG. 1 shows prior art systems.

List of elements:
1000 Removable cryotransfer system
001 Sample carrier with cryosample
002 Cartridge
002a Cartridge for single sample cartridge
002b Multispecimen cartridge type A
002c Multispecimen cartridge type B
002d Multispecimen cartridge with springs on the side
003 Recess to place the specimen and the spring
004 Springs to clamp various sample carriers
005 Support surface for sample carrier
006 slit to slide the sample carrier into the cartridge
007 position of sample/sample carrier
008 cartridge grip
009 hole to pull out cartridge from Cryo+ sample holder
011 Specimen cartridge with embedded clamping means
012 clasp
013 axis for rotation of clasp
014 fixing means to lock the clasp in clamping position
021 single specimen cartridge with bayonet spring fixation
022 pin on the cartridge under which the spring is fixed by rotation
023 special spring with steps 024
024 steps in spring to fixate the spring under pins 022
031 metal plate for preloading of the spring
032 spring-like component to allow fixation of cartridge
033 elongated holes in cartridge releasing springs
041 Round very thin metal-based sample carrier with grid-like structure to support a thin film of e.g. amorphous carbon on which the cryo sample is supported.
042 Rectangular sample carrier of a metal or ceramic with a relatively thick rim and a sunken central thin area
043 Rectangular MEMS based sample carrier
044 Rectangular metal-based sample carrier like 042 but with a spring component 049 such that sample carrier is fixed in cartridge without any additional clamping means.
045 Grid like support area
046 Sunken area with specific support of cryosample
047 Thin film made during the cleanroom process of the MEMS fabrication
048 Recess made by cleanroom process such as KOH etching
049 Metal bridge that acts as spring
051 area inside the plunge freezer or cryomicrotome
052 Dewar
101 Cryocontainer (CC) with cryo samples on sample carriers
201 Support for CB and CC
202 Cartridge block (CB)
203 Slit in the CB aligned with the slit in the cartridge
204 Pressing tool
205 Slit of multi sample cartridge
206 Tweezers
207 Position of pressing tool 204 in parking position
208 Position of pressing tool 204 in pressing position
209 Separator for two neighboring not connected slits
211 Dewar
212 Liquid nitrogen
213 Cold nitrogen gas
301 Cartridge block transporter (CT)
302 Slider on which CB is mounted
303 click connection of slider to CB
304 O-ring
305 Cartridge mover to push out the cartridge
306 Pushing aid remaining in CB and is kept in place by spring 307 if no pushing force is applied by cartridge mover
307 spring
308 vacuum coupler
309 Low thermal conductance coupling in slider 302
310 Low thermal conductance coupling in cartridge mover
401 Cryo vacuum loading chamber (CVLC)
402 Tube to house and support Cryo+ sample holder
403 Viewing window
404 Valve
405 Connection to pre vacuum pump
406 Extra valve
411 Cooling rod
412 Thin stainless steel tube
413 Cryo-aligner
414 Vacuum tight connector
415 Cu braid
416 Liquid nitrogen
417 Dewar
501 Cryo+ sample holder
502 Outside tube of Cryo+ sample holder
503 Cooling rod of Cryo+ sample holder
504 O-ring
505a Airtight connector
505b low thermal conductance connecting tube
506 Airtight and low thermal conductance connector
507 Cooling braid to cool the cooling rod 503 inside Cryo+ sample holder
508 Interior of Cryo+ sample holder with its own vacuum
511 Tip of Cryo+ sample holder
512 Sample position in the tip
513 counter grip to move the cartridge 002a-002c
515 dock
516 round hole for TEM investigation of cryo sample
517 slit (passage) for TEM investigation of cryo sample
521a Vertical movable cartridge storage rack
521b Rotatable cartridge storage rack
522 Cartridge storage mover
523 guidance for cartridge moving ribbon
524 driver for the movement of the cartridge ribbon
525 cartridge moving ribbon
525a end of cartridge moving ribbon
526 coiled up cartridge moving ribbon
527 housing of coiled up ribbon
528 profile in cartridge moving ribbon
529 profile in driver 524 matching profile in the ribbon
531 Provision for keeping braid 507 in vertical orientation
532 Spiraled braid that unwinds/winds with a corrective rotation (with 532a and 532b for the situation with holder in the airlock position and the holder fully in the TEM position)
533 O-ring
534 Ball bearing (optional)
535 Sensor
536 Rotatable head of holder with cooling braid 507

Figure 10:
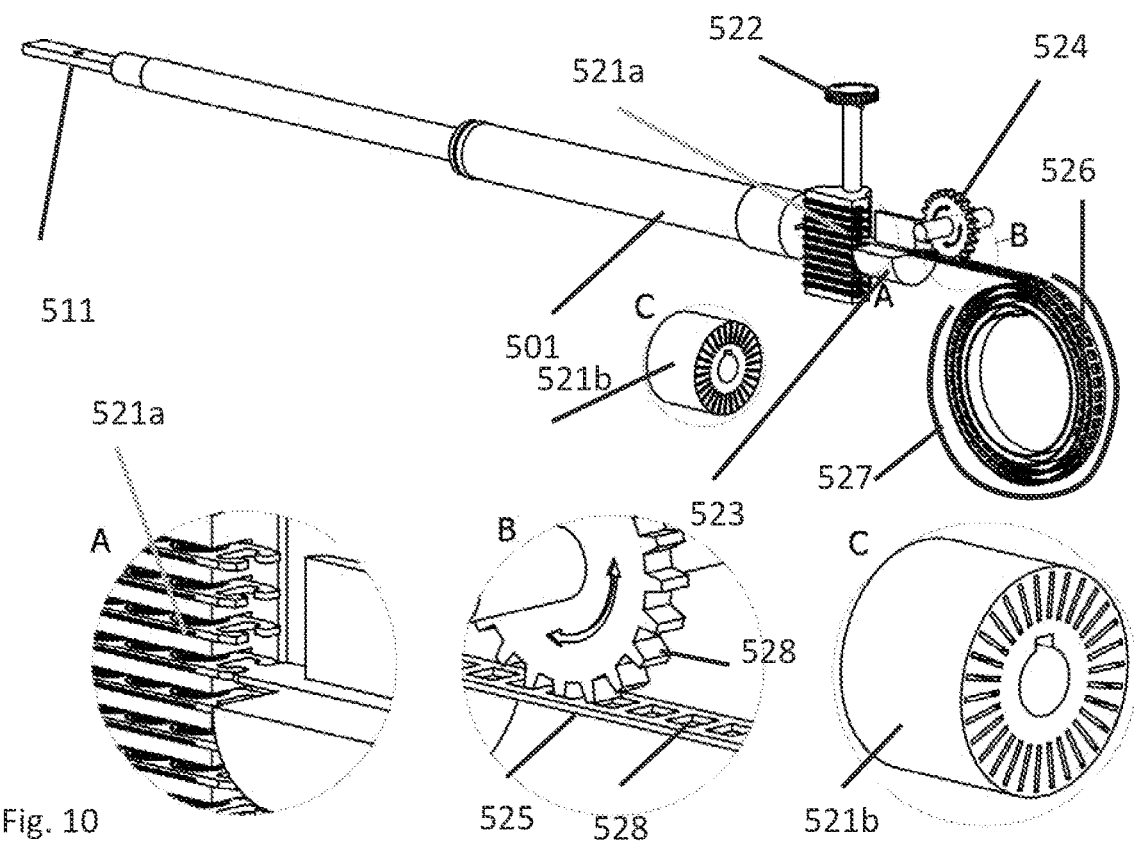

537 Non-rotatable part of the holder End of spiraled braid very well connected to cooling rod
538a Pin on the holder in position if holder fully inserted
538b Pin on the holder in position if holder in airlock
539a End of spiraled braid very well connected to connector to cooling braid in liquid nitrogen
539b End of spiraled braid very well connected to the cooling rod 503
541 Opening in outside tube
542 Connection
543 Extra space
544 Flat part
545 Stop in closed position
545a Stop in open position
546 Slider to open/close the connection 542
547 O ring to allow for airtight sliding of 546
548 Opening between 543 and 508
551 Embedded connection in the outside tube
552 channel underneath the O ring
553 O ring
554 Opening to interior of Cryo+ sample holder
555 Movable shutter
561 extendable protection
562 Connection of extendable protection to the Cryo+ sample holder
563 Connector of extendable protection to the CVTC or goniometer
564 support of extendable protection
565 wire like connection
566 cold trap (optional)
567 Removable shutter for the protection
568 bag-like container for some liquid nitrogen
569 wire to hang bag-like container to Cryo+ sample holder
570 Liquid nitrogen (small amount)
571 Transport from plunge freezer to Cryo loading container
572 Transfer from cryocontainer to cartridge
573 Transport from cryoloading dewar to CVTC
574 Transfer of cartridge from CB to Cryo+ sample holder
575 Transport of Cryo+ sample holder from CVTC to TEM
601 Transmission electron microscope
604 Vacuum in TEM column
605 Vacuum in airlock of goniometer
611 Goniometer of TEM
621 Dewar next to TEM and fixed to the TEM column
622 Liquid nitrogen
623 Sensors to determine height of liquid nitrogen
631 System to add liquid nitrogen to dewar 621
632 Liquid nitrogen
633 Valve for liquid nitrogen
901 Container for liquid nitrogen with opening 902 to receive cryo holder
902 Opening and support for cryo holder
903 Liquid nitrogen
904 support block
911 Cryo transfer holder
912 Tip of cryo transfer holder
913 Dewar on cryotransfer holder
914 Liquid nitrogen
915 O-ring
921 Cover that can be placed over sample area
922 Tool allowing the movement of the cover 921
923 Valve to allow pumping of the inside of the holder
931 Transmission electron microscope
932 Goniometer
941 Transport from plunge freezer to Cryo loading container
942 Transfer from cryocontainer to tip of the Cryo+ sample holder
943 Transport from cryoloading container to TEM
951 TEM dedicated to cryo-samples
952 Goniometer
953 Fixed sample holder
954 Tip of sample holder for receiving samples
961 Cryosample loader
971 Transport from plunge freezer to Cryo loader on TEM
972 Transfer from cryoloader to sample holder
981 Prior art cryo transfer holder
982 Outside tube of TEM sample holder
983 Cooling rod of TEM sample holder
984 O-ring
985 Airtight connector
986 Airtight and low thermal conductance connector
987 Cooling braid to cool inside sample holder
988 Temperature sensor
989 Heater
991 Tip of sample holder
992 Sample position in the tip
993 Vacuum inside TEM column
994 Vacuum in the airlock of the goniometer
995 Interior of holder with its own vacuum
996 Valve to allow pumping of interior part of holder In addition a Cryo+ sample holder may be provided. The Cryo+ sample holder can contain a cartridge storage rack (CSR) in which several cartridges can be loaded for a sequential TEM inspection without removing of the Cryo+ sample holder from the TEM to exchange cartridges. This CSR is placed in the example in FIG. 10 in the part of Cryo+ sample holder that is positioned outside of the goniometer. Note that all parts that are used for the storage have to remain at <100 K all the time and that all parts that are used for moving the cartridges have to be at <100 K during all contacts with the cartridges. In FIG. 10, all these parts, so including the latter ones, are kept at <100 K all the time.

It is noted that some of the present elements in the workflow can be combined.

Storage in and transport of the cryocontainer can be avoided by loading of a sample or samples into cartridge(s) in a CB directly in a quench freezing system or the cryo-ultramicrotome. In this case the CB is placed in the quench freezing system/microtome and by using the CBT the CB is removed from this equipment to the CVTC. Transport of a CB can be avoided by placing the cryocontainer directly in the CVTC and loading of the sample carrier in a CB located in the CVTC, which is subsequently used to insert the sample carrier in cartridges that are positioned directly in front of the Cryo+ sample holder. The loading of the cartridges through the tip of the holder can be avoided by loading a cartridge storage rack directly into the position of the CSR in Cryo+ sample holder (which may require a different cryo vacuum connection to the Cryo+ sample holder). Each of these combinations requires some dedicated adjustments to the remaining equipment.

The present cryotransfer system is mainly intended for use in life sciences and allows for a low price alternative for high end cryo-TEM systems, which have a cryo transfer system that is integrated in the TEM. Also since it is versatile and can be introduced in any given TEM, the Cryo+ sample holder can be inserted in a TEM with very special features, such as a specific energy filter or an aberration corrector. Furthermore the narrow passage 517 relating to a slit in the present Cryo+ sample holder above and below the sample acts as a cryo shield, such that also TEMs without an internal cryo shield can be used. With the present cryo transfer system the handling and loading of a sample carrier into the cartridge can be done manually or by a robotic system with a simple movement. Loading typically comprises placing a sample carrier through a slit in a cartridge and clamping the sample carrier, such as with a preloaded spring. A thickness of the sample carrier is typically 1-100 µm for metal grids of uniform thickness, 50-500 µm thick for metallic and ceramic sample carriers with a thickness profile and 100-1000 µm thick for semiconductor MEMS based sample carriers. The lateral dimensions of all these carriers are typically 0.5-5.0 mm, whereas a size of a recess typically is 0.1-2 mm; a thickness of the cartridge typically is 0.1-3 mm. In a configuration for receiving a sample carrier, the clamp can be preloaded in the cartridge or is part of the sample carrier as in 044. An advantage is that the sample carrier can be loaded through the slit to a position in the recess of the cartridge and can be clamped by simple operations. Also an advantage is that the present cartridge can receive various and different samples, in one cryo-session. A further advantage is that the sample carrier need not to be spherical but can have many other shapes. The placement of the cartridge in the microscope can be established under reduced contamination conditions, preventing atmospheric gases such as water from condensing on the sample, etc. In addition the cartridge can be moved into the Cryo+ sample holder, such that a further sample in the cartridge can be placed at the position of the electron beam. The cartridge can be equipped with a spring to improve mechanical coupling to the Cryo+ sample holder, therewith providing a firm and stable arrangement. The present system in addition provides a closable connection between the internal vacuum of the Cryo+ sample holder and the (intermediate) vacuum of an (electron) microscope to an interior space (508) of the Cryo+ sample holder.

With the present system a simple "move-up move down" procedure is sufficient to place a sample carrier e.g. from a sample container into the cartridge. One may use several sample carrier locations within one cartridge and the use of sample carrier shapes to increase sample carrier density. It is preferred to use a cartridge block in order to reduce temperature fluctuations and to prevent ice formation on the sample. Also a closable pumping line from the EM vacuum to the inside of the Cryo+ sample holder. The present system provides the possibility to load a cartridge with several sample carriers, whereby the multi-specimen cartridge has a profile that fits in terms of shape into a profile in a beam, such as a ribbon, that may stretch out in a cooling rod of the Cryo+ sample holder, and this beam can be shifted along the axis of the Cryo+ sample holder with an ultimate position in one direction to receive the cartridge and can be shifted in the other (opposite) direction such that the cartridge can be placed in a cartridge storage rack and with an intermediate set of positions such that all specimens in the cartridge can be place on the electron beam axis. An advantage of the present multispecimen cartridge for life science applications is that several samples can be investigated in one session of a single cryo transfer into the microscope, which is important because the success rate for good samples may be relatively low. It also provides the possibility to load a cartridge with a single specimen in a narrow recess in the tip of the Cryo+ sample holder, whereby the cartridge has a spring like component that clamps the cartridge into the recess, which cartridge can be loaded from the tip of the holder, or from the side of the tip. In an example a slit-shaped passage 517 is provided in the tip of the Cryo+ sample holder at the position of the electron beam such that it allows continuous imaging while rotating Cryo+ sample holder about its axis (α tilt) and reduces the number if incoming water molecules on the sample, such in order to reduce the formation of a layer of ice on the sample. Further one can load a cryosample that is plunge frozen on a sample carrier in equipment dedicated for the plunge freezing or obtained by cryo-ultramicrotomy and placed on a sample carrier, directly (through the slit) into the present cartridge.

In general the spring in the cartridge can be loaded in the recess of the cartridge at room temperature. In order to keep the spring in the cartridge in the required position, such that a sample carrier can be placed underneath the spring by using the slit in the cartridge, first a metal plate that is slightly thicker, like 50 µm, that the sample carrier that one wants to load and having on one end the shape of a sample carrier is loaded in the slit up to the sample carrier location, whereby the plate sticks out of the cartridge such that it can be easily removed. Next the spring is placed in the recess and pressed to the metal plate, after which the metal plate is removed. If a cartridge is thicker, other clamping means may be used.

In the example given in FIG. 10 the storage rack 521a contains 10 positions for cartridges, and the loading of the cartridges into the CSR is done in the following way. First the CSR is brought in position 1, which is the position of cartridge 1. Next the cartridge moving ribbon (CMR) 521 is pushed through the opening for cartridge 1 and through the cartridge guidance slit (CGS) to the tip of the Cryo+ sample holder and the cartridge is mounted on the CMR and pulled back through the CGS with the CMR into the CSR. Next the CMR is decoupled from the cartridge, pulled back a bit such that the CSR can be moved to a position that cartridge position 2 is aligned with the CMR and the CMR is pushed to the tip to collect cartridge 2, etc. Preferably the CMR is of a thickness such that it can slide easily through the CGS without a significant friction force. In the example given in FIG. 10, the movement of the ribbon is realised by a gear like disk with pins 529 that fit in counterpart holes 528 in the ribbon. The ribbon can be straight but this requires a considerable increase in length of the Cryo+ sample holder. In the example given in FIG. 10 the ribbon is wound to a spiral 526. In case of a spiral a guidance of the ribbon close to the contact position to the cartridge is needed.

The cartridge storage rack as shown in Figure X consists of 10 positions for cartridges of 0.4 mm thick with spacing elements of 0.6 mm wide that act as (aligning) support of the cartridges. When one wants to load a cartridge the spacing element above the given cartridge is brought in line with the CGS and the CMR, next the ribbon is placed in the position that the connecting parts of the ribbon and the cartridge are aligned and next the cartridge storage rack is moved up to make the coupling. The next step is that the cartridge can be pushed into the CGS of the cooling rod of the Cryo+ sample holder, up to a position such that one of the samples is in a position for TEM inspection.

FIG. 1 shows prior art cryo loading procedures. The procedure with a dedicated cryoloader integrated in the TEM is shown in the bottom and the procedure with a conventional side entry into the goniometer is shown in the top. For cryo transfer of the sample holder 911 that is kept in the Dewar 901 by a support 902, a cover 921 is placed over the cryo sample by means of a driver 922, to reduce the ice deposition on the cryo sample; this cover is shifted once the holder in is the TEM.

Figure 2:
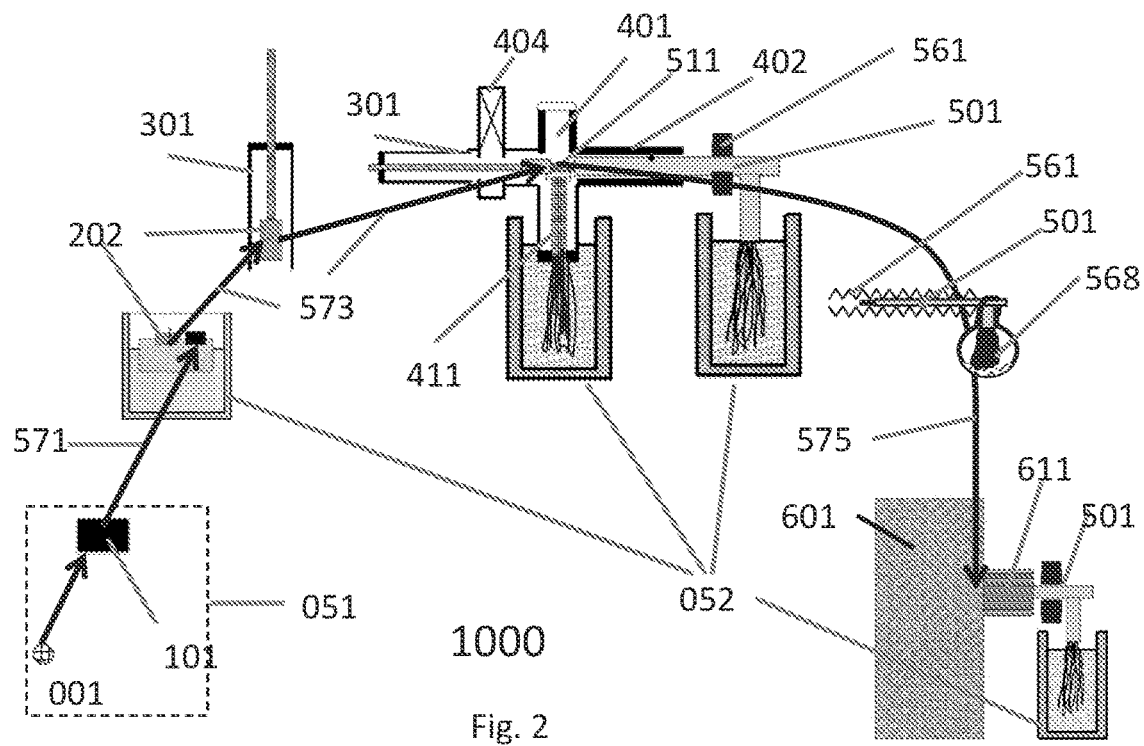
Figure 4A:
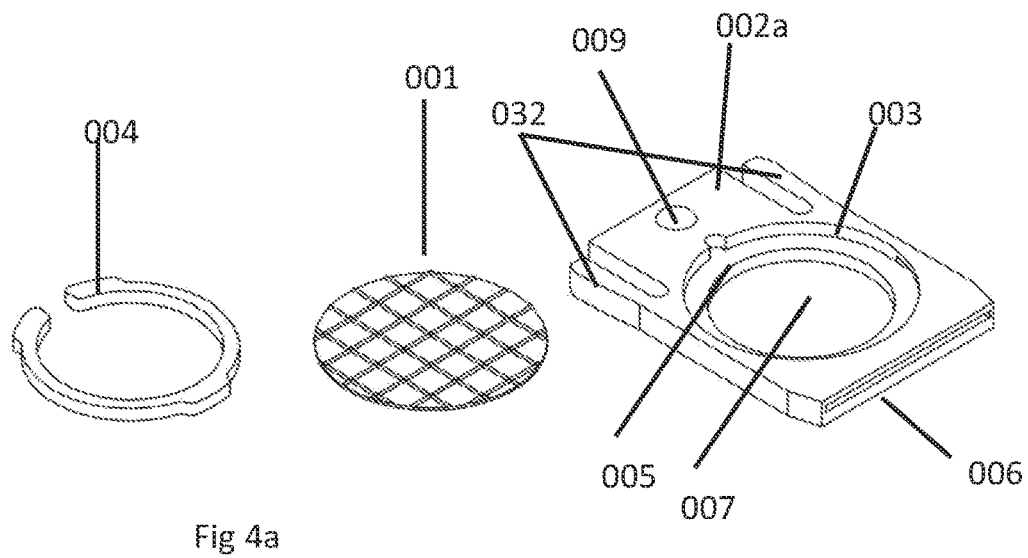
Figure 4B:
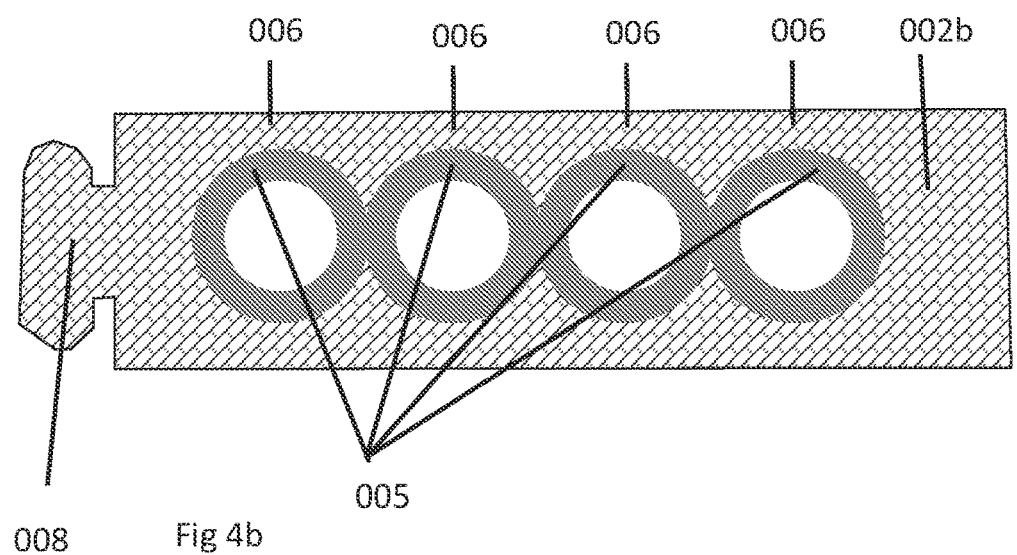
Figure 4C:
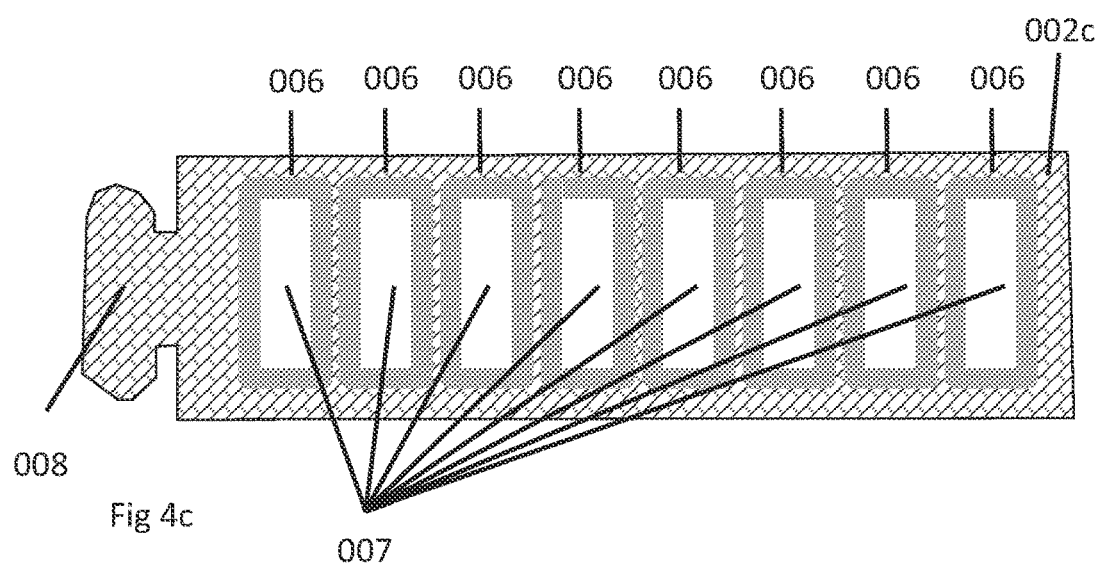
Figure 4D:
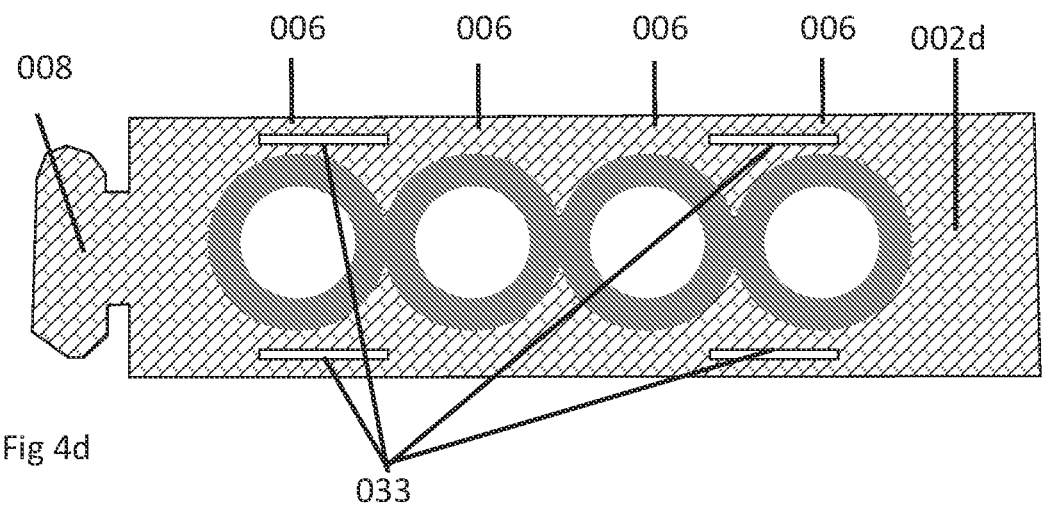
Figure 4E:
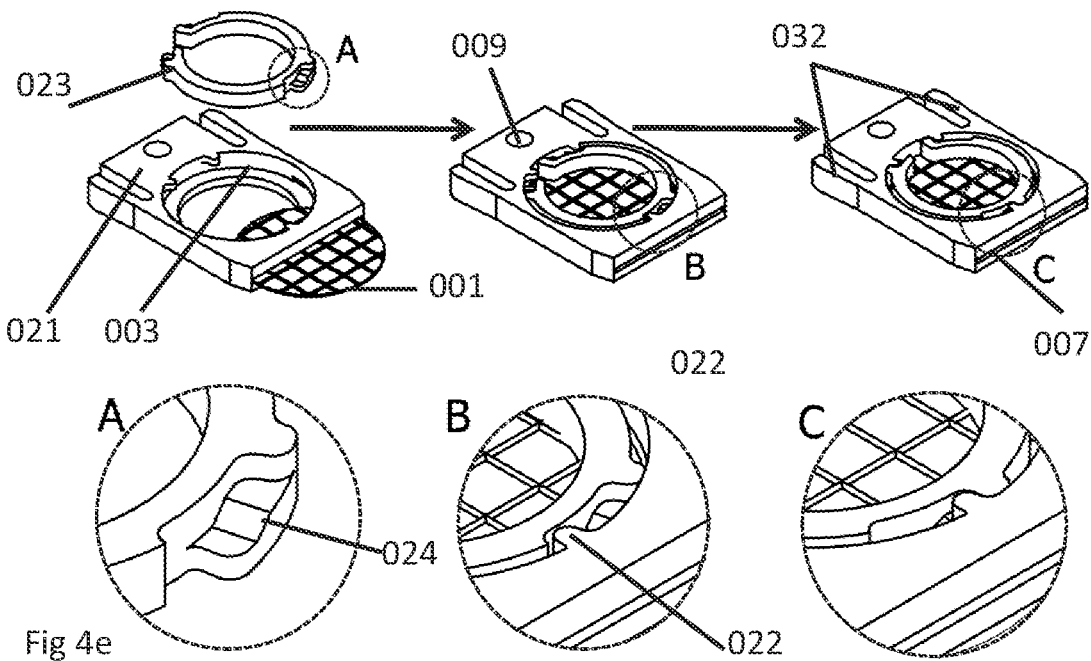
Figure 4F:
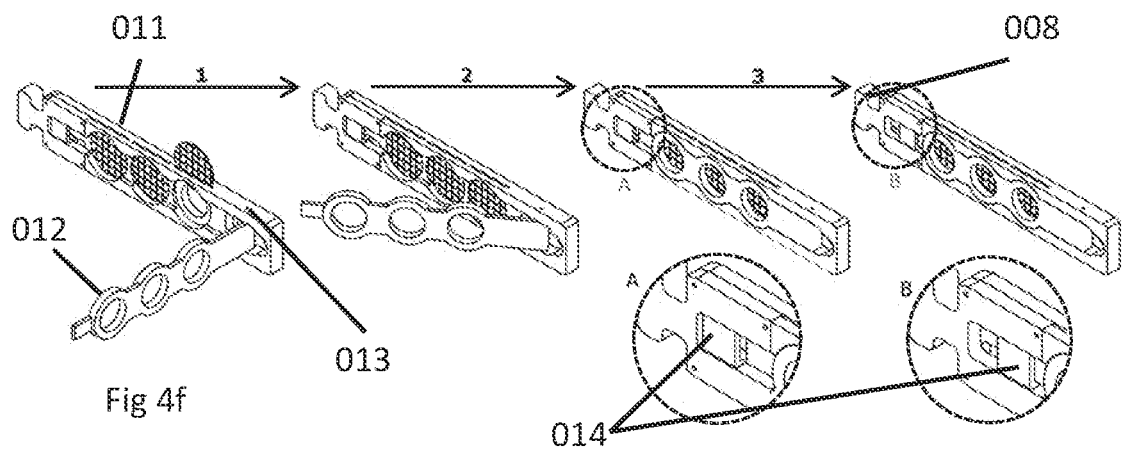
Figure 5A:
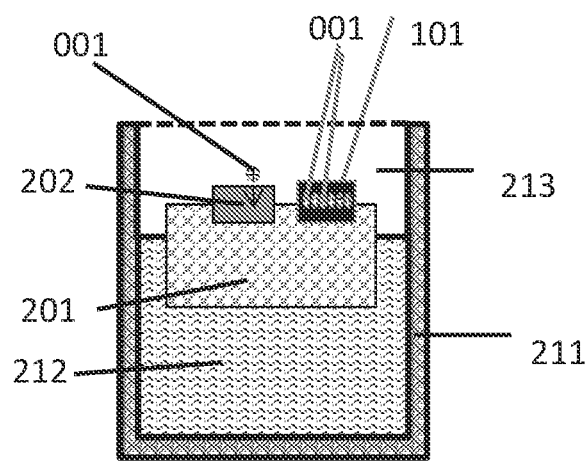
Figure 5B:
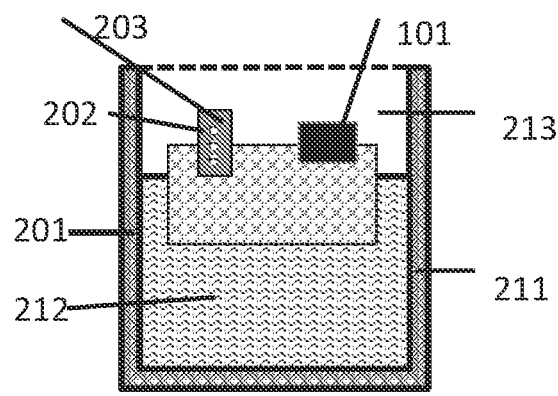
Figure 5C:
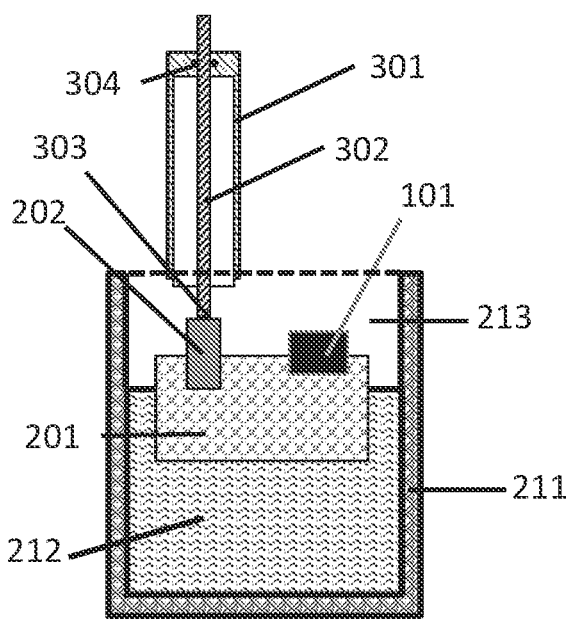
Figure 5D:
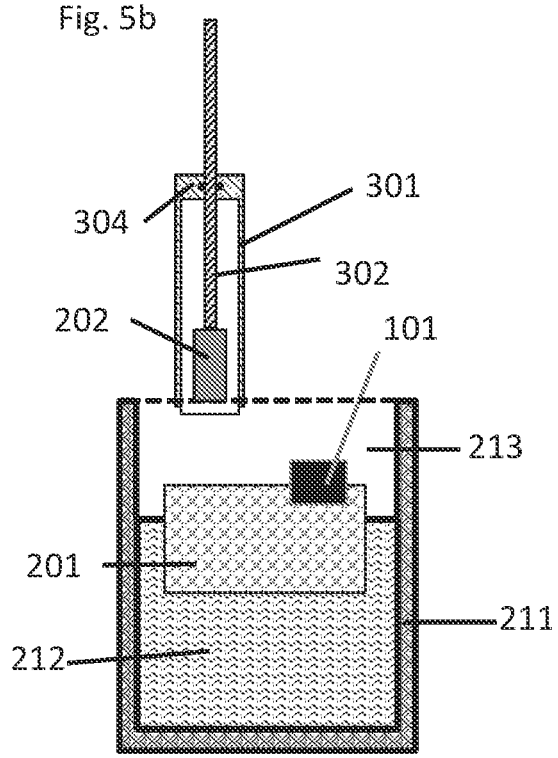
Figure 5I:
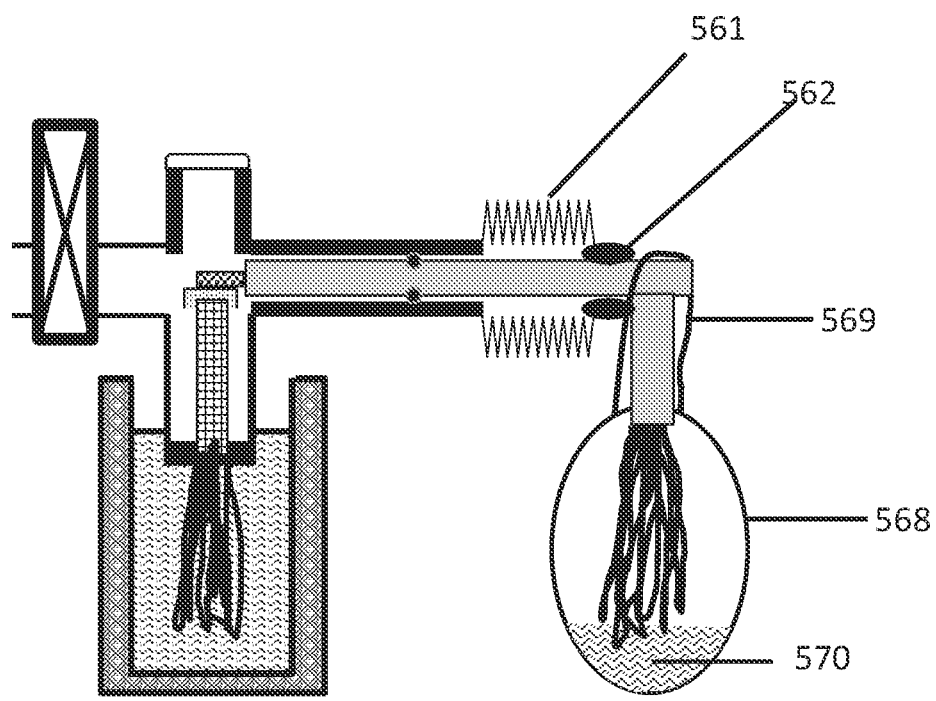
Figure 5J:
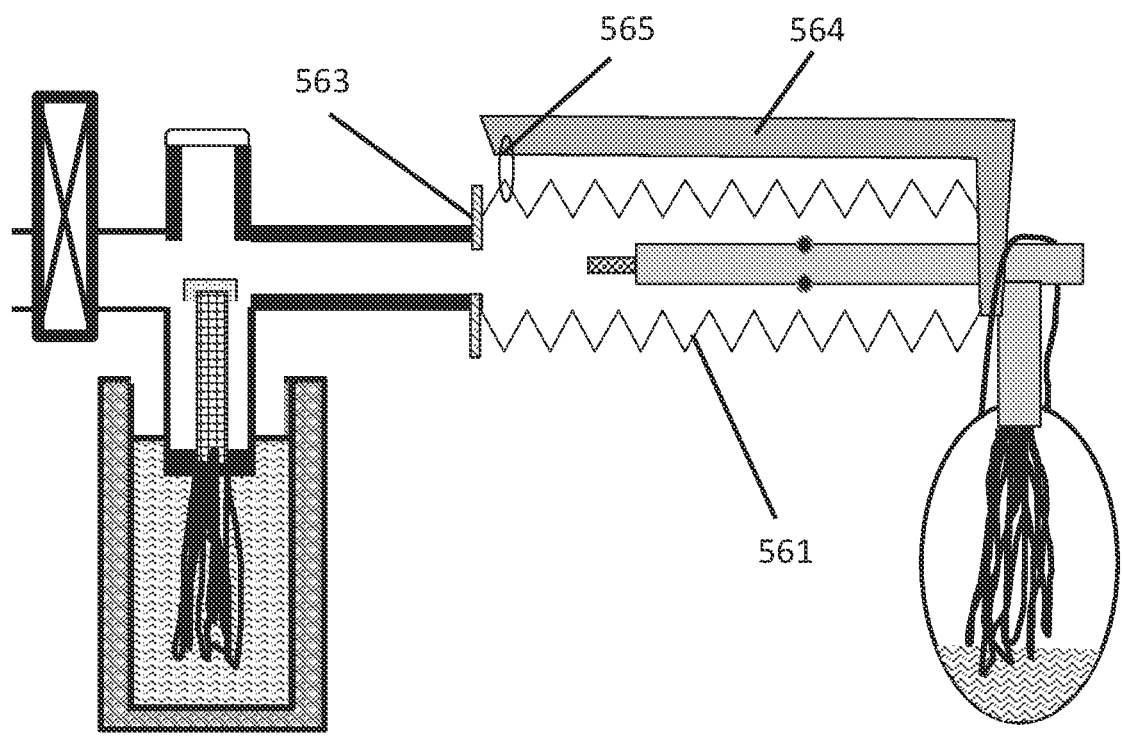
Figure 5K:
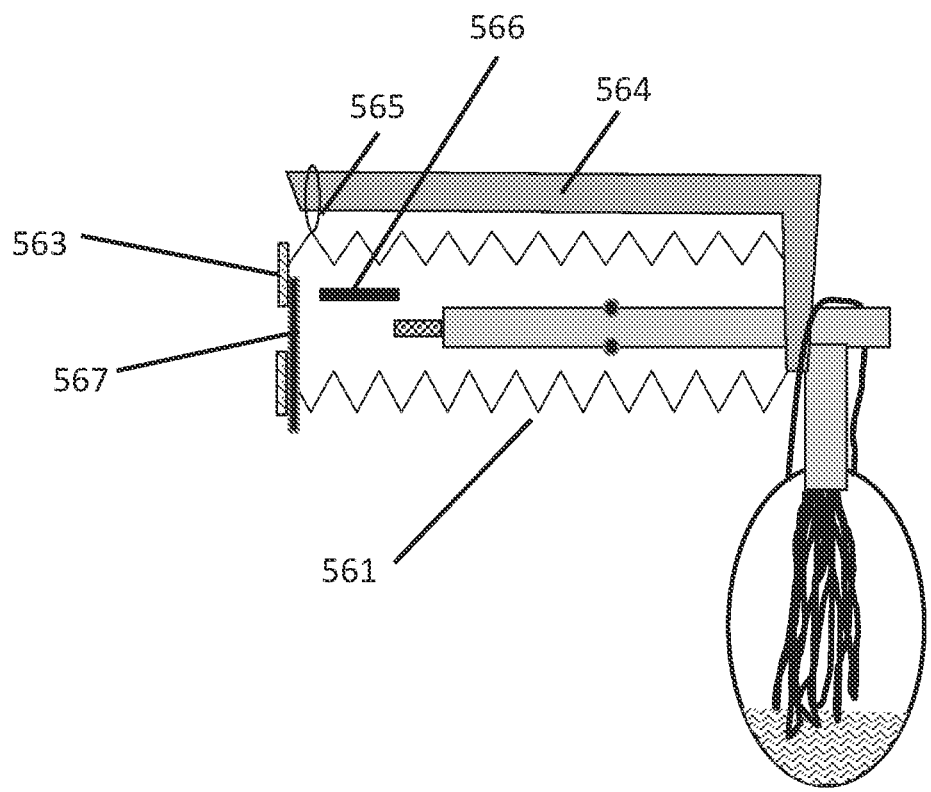
Figure 5L:
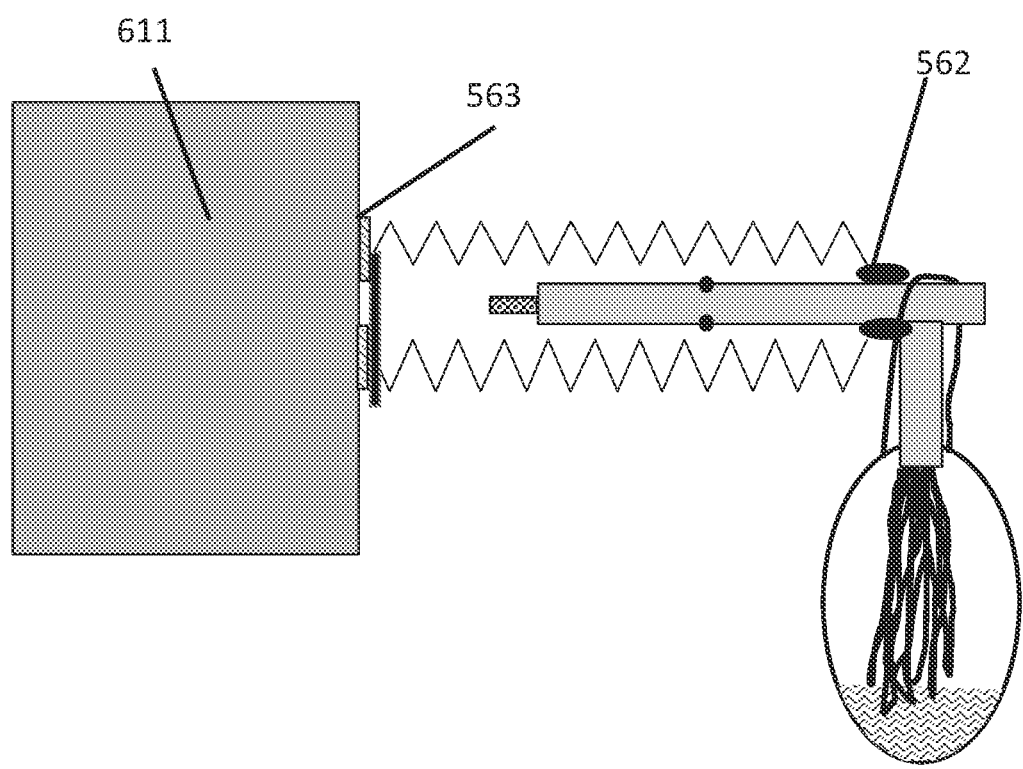
Figure 5M:
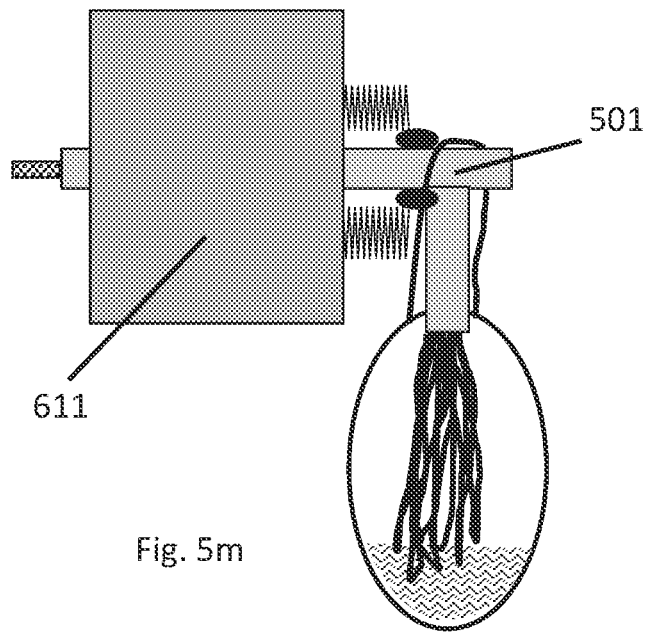
Figure 5N:
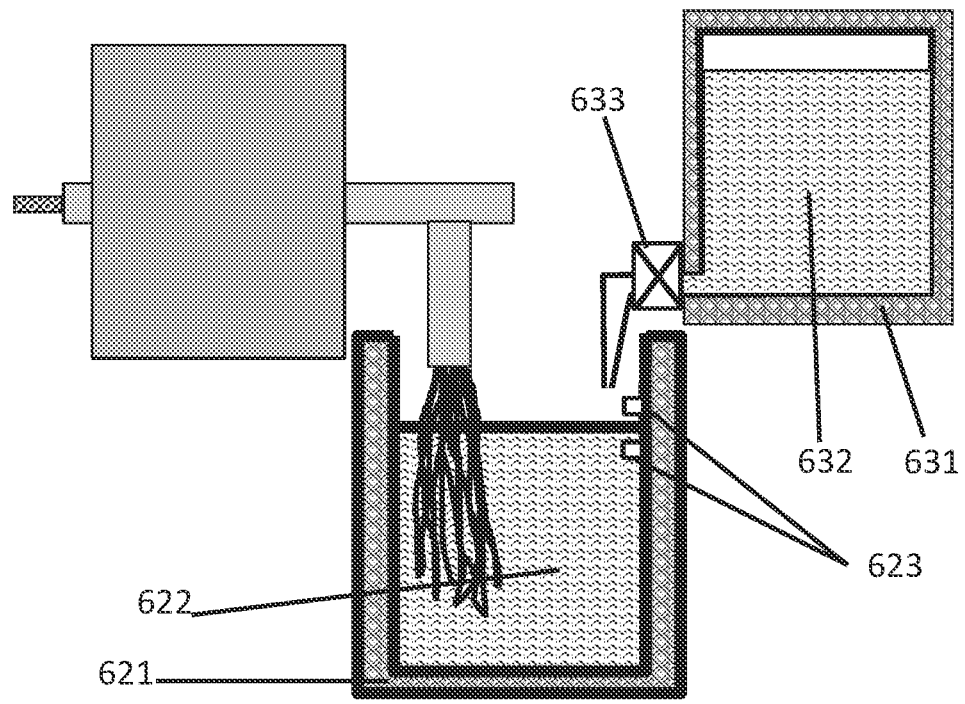

FIG. 2 shows a workflow of the cryo loading process. The starting point is that cryosamples are available. These cryosamples are typically mounted on sample carriers, which are presently mostly very thin round discs, but may be have any shape according to this invention.

In step 1 these sample carriers are loaded under cold nitrogen gas (<100K) in a Dewar 502 into cartridges 002, which are stored in a so-called cartridge block (CB) 202. This loading block served as a tool to allow easy handing of the cartridges, preloading of the clamping means to fix the sample carriers firmly in the cartridge, shielding the cryosample from deposition of water and allowing transfer into the CVTC 401 for loading the cartridges in the Cryo+ sample holder 501.

In step 2 the CB is taken for the Dewar using a CBT 301 to the CVTC. In the CVTC the cartridges (and thus the cryo samples) are at <100K all the time and a high vacuum is maintained to ensure that the cryosamples during the transfer from the CB into the Cryo+ sample holder are contaminated as little as possible with ice.

In step 3 the cartridge is pushed out of the CB and placed into the Cryo+ sample holder. In case of a cartridge with a single specimen the cartridge can be pushed directly in the Cryo+ sample holder. In case of a multiple sample cartridge the cartridge has to be coupled to a Cartridge Moving Ribbon 525 that can pull the cartridge into the cartridge guidance slit in the Cryo+ sample holder and can position any of the samples in the electron beam area.

In step 4, the Cryo+ sample holder is taken out of the CVTC and is placed quickly in the goniometer 611 of the TEM 601.

FIG. 3 shows several sample carriers with cross sections on the right. FIG. 3a shows a typical commercial metal grid 041 that is 10-30 μm thick. FIG. 3b shows a metal based or ceramic based sample carrier 042 with a structure in the centre optimized for the type of sample one wants to load. The central area 046 is sunken to provide protection against clamping means. FIG. 3c shows a MEMS-based sample carrier 043 with a thin foil 047, possibly with holes of specific sizes and with a recess 048 on one side, which is realized by KOH etching from the backside. FIG. 3d shows a metal based sample carrier 044 with slits on two opposite sides such that the remaining bars 049 can be used as springs.

FIG. 4 shows several cartridges. FIG. 4a shows a cartridge 002a for a single sample carrier, which is round like for instance a conventional grid 041 as shown in FIG. 3a and a spring 004 to clamp the sample carrier and wing-like springs 032 allowing clamping the cartridge in the Cryo+ holder. FIG. 4b shows a cartridge 002b for 4 round sample carriers and the grip 008 allowing pulling and pushing it in the Cryo+ sample holder to position it with respect to the electron beam. FIG. 4c shows a cartridge 002c for 8 rectangular sample carriers. FIG. 4d shows a cartridge 002d for 4 round sample carriers with slits 033 that allow deforming the remaining bars to function as springs. FIG. 4e shows a cartridge 021 for a single round sample carrier whereby the carrier is clamped with a spring that is placed with a bayonet-like mechanism. FIG. 4f shows a cartridge 011 for a four round sample carriers, whereby the clamping is done with a clasp 012 that is fixed with a slider 014.

FIG. 5 shows several components involved in cryoloading process. FIG. 5a shows the configuration for the loading of the sample carrier in the cartridge. Sample carriers 001 are taken from the cryocontainer 101 and placed in the cartridge 002 that in located in the cartridge block 202. FIG. 5b shows that the cartridge block is rotated over 90°. FIG. 5c shows that the slider 302 of the cartridge block transporter 301 is connected 303 to the cartridge block. FIG. 5d shows that the cartridge block transporter is taken out of the dewar with the cartridge block in the tube of the cartridge block transporter to ensure small ice formation on the cartridge block. FIG. 5e shows how the cartridge block transporter is connected to the cryo vacuum transfer chamber 401. FIG. 5f shows the configuration where the cartridge block is placed on the cryo-aligner 413. FIG. 5g and FIG. 5h show the loading of the cartridge in the tip 511 of the Cryo+ sample holder, which movement is realised by the cartridge mover 305, which presses the pushing aid 306 that presses the cartridge into the tip 511. FIG. 5i and FIG. 5j show the preparation for the transfer of the Cryo+ sample holder to the goniometer of the TEM; in FIG. 5i and transportable bag 568 with some liquid nitrogen 570 is hung up on the holder; in FIG. 5j the holder is pulled back from the CVTC while the extendable protection is pulled over the Cryo+ sample holder. In FIG. 5k the extendable protection is disconnected from the CVTC and connected in FIG. 5i to the goniometer 611. FIG. 5m shows how the Cryo+ sample holder is in TEM operating position in the goniometer with the transportable bag-like cooler 568 still in place. FIG. 5n shows the final configuration with a special dewar 621 with height sensors 623 to regulate the height of the liquid nitrogen 622 and the means 631-633 to add liquid nitrogen.

Figure 6:
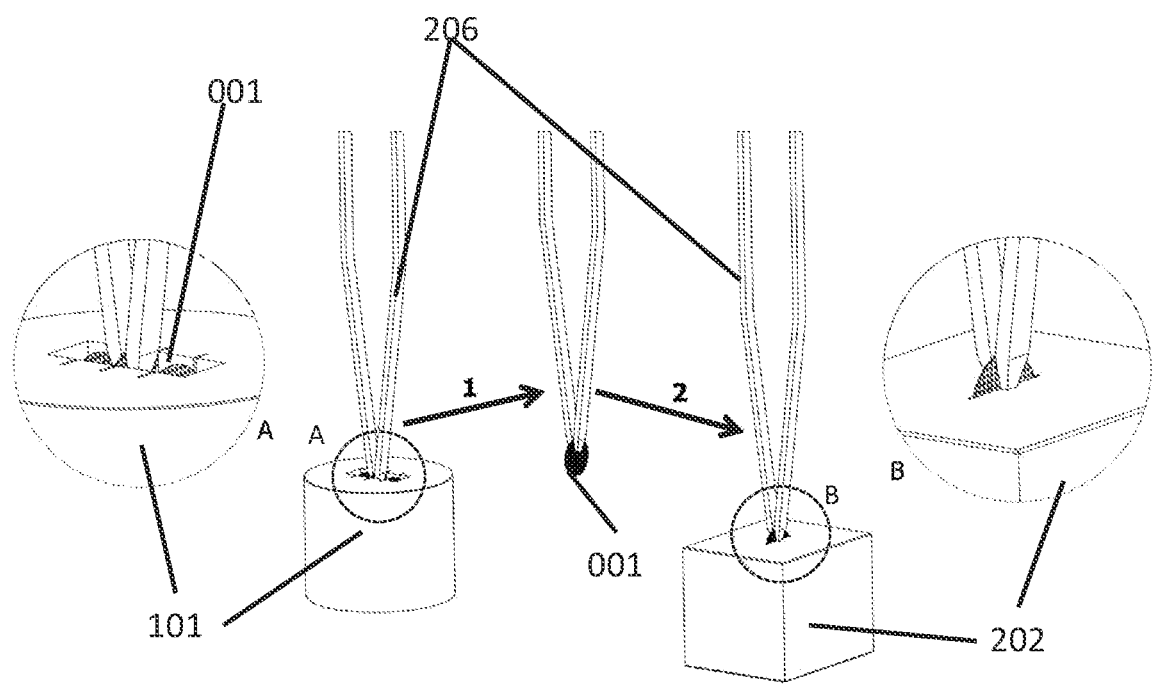

FIG. 6 shows the simple transfer by a tweezers 006 of a sample carrier 001 from the cryocontainer 101 to the slit in the CB 202 that is just above the corresponding slit in the cartridge.

Figure 7:
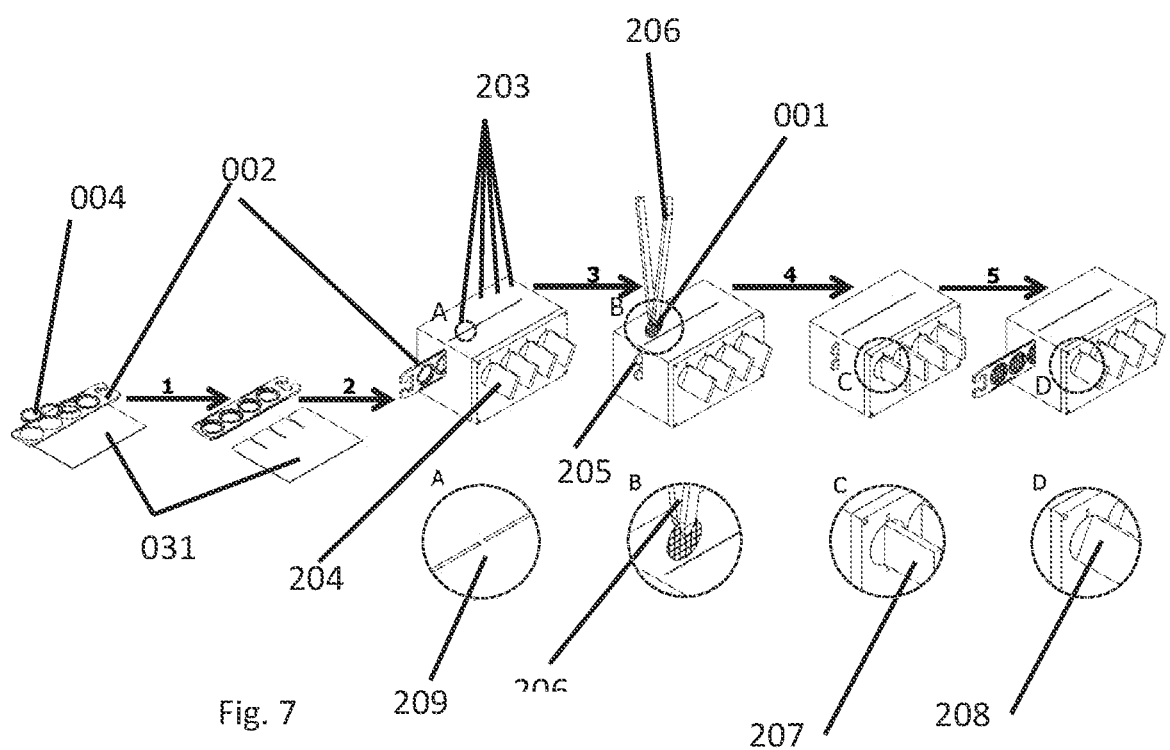

FIG. 7 shows loading of a sample carrier in the cartridge that is positioned in the cartridge block 202 and the tools 204 to press the spring onto each sample carrier. After the springs 004 are loaded in the cartridge 002 at room temperature using the metal plate 031, the cartridge is loaded in the slit 205 and sample carriers are loaded through the slits 206 after which the springs are pressed onto the grids using the pressing tools 204.

Figure 8A:
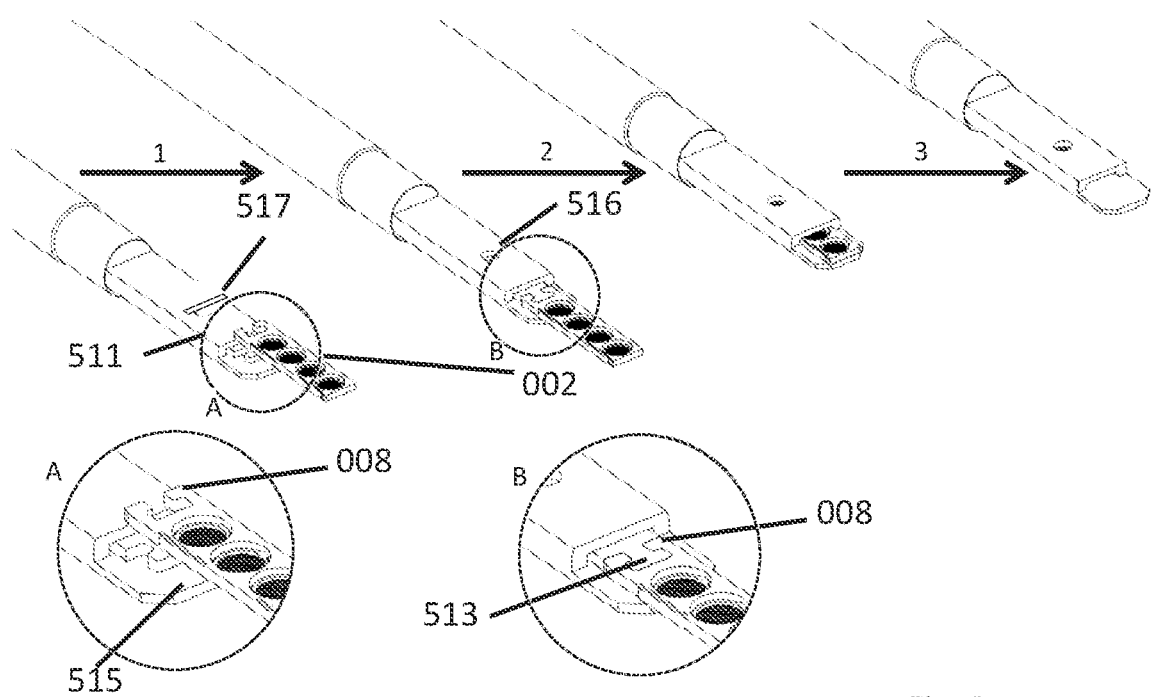
Figure 8B:
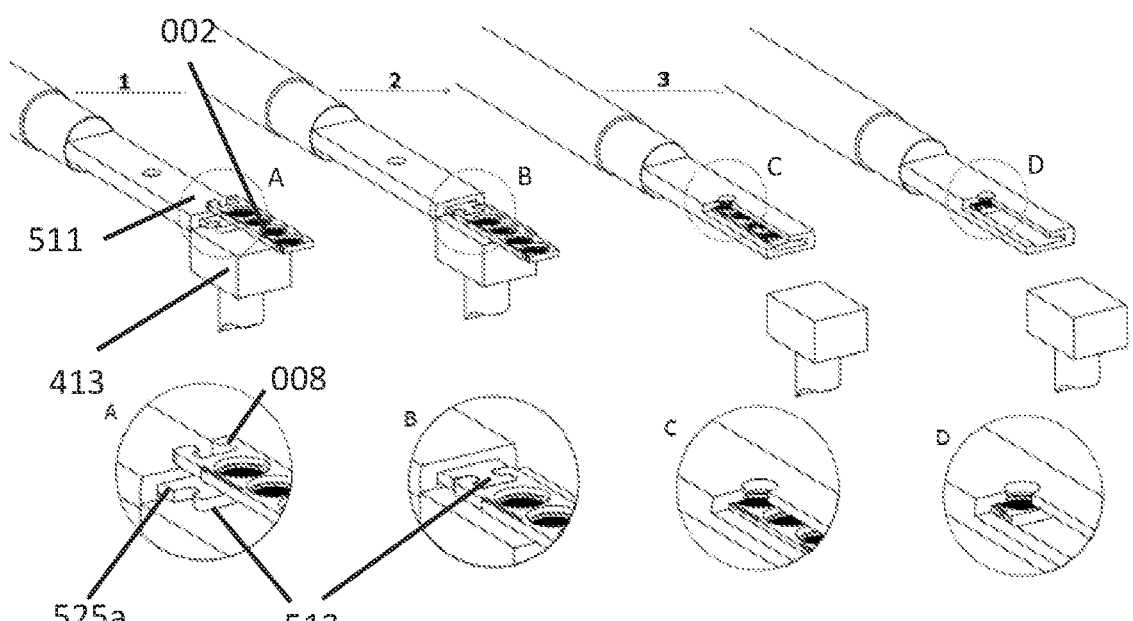

FIG. 8 shows two alternative methods the load a multi sample cartridge into Cryo+ sample holder. In FIG. 8a the Cryo+ sample holder contains a dock 515 which serves as support to make the connection between the grip 008 of the cartridge 002 and the counter grip 513 on the cartridge moving ribbon 525. In FIG. 8b the cryo-aligner 413 serves as the support to make the connection.

Figure 9A:
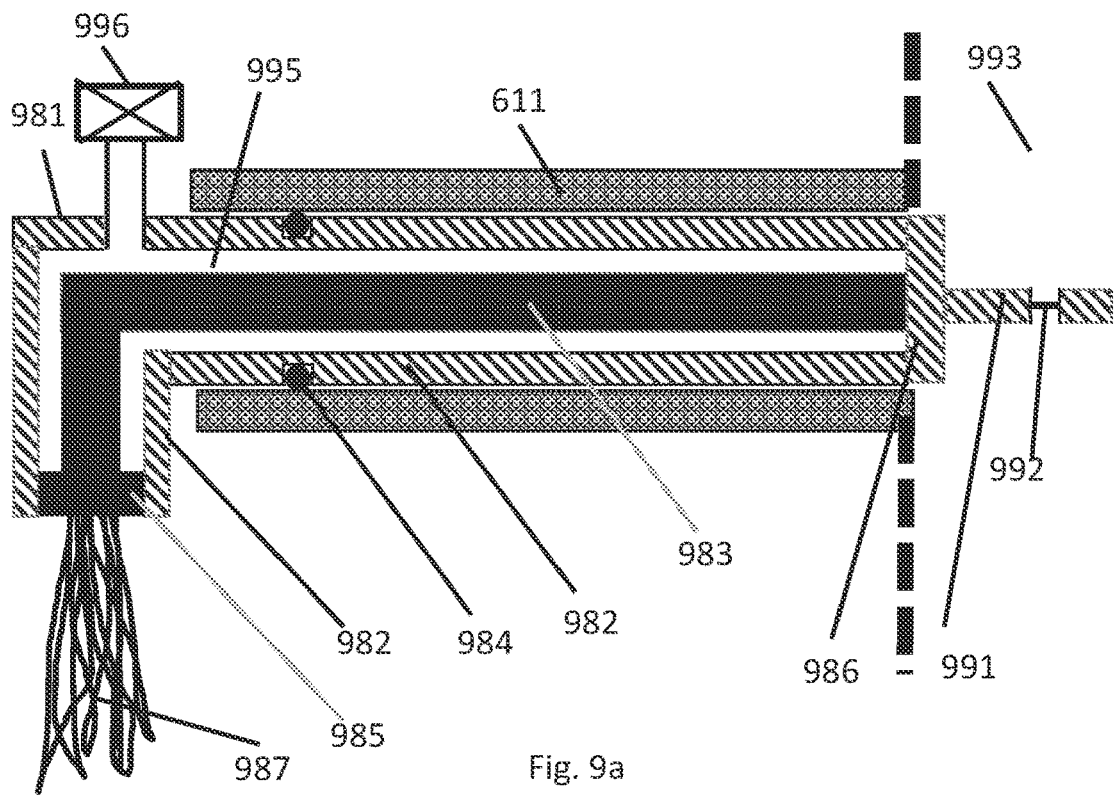
Figure 9B:
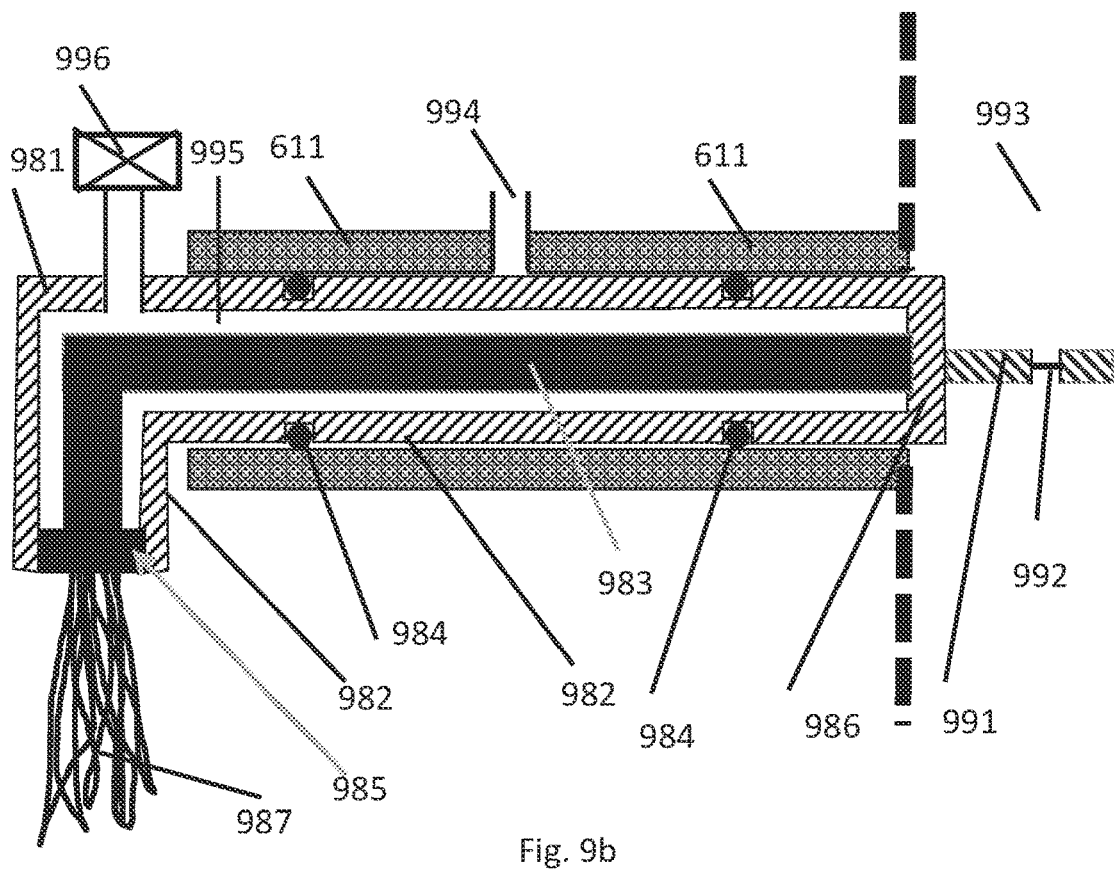

FIG. 9 shows several possibilities to keep the inside of Cryo+ sample holder at a low pressure using the pumping systems of the TEM. FIGS. 9a and 9b show prior art systems, in which the inside 995 of the cryo transfer holder is not pumped by the TEM vacuum, but is pumped using valve 996 prior to the TEM experiment. The O-rings 984 in the outside tube 982 are used to ensure that a good vacuum can be realised in the TEM, once the sample is fully inserted. When two O rings are present, the area 994 in between the two O rings is pumped. To realise a low vacuum in order to have a low loss of coldness of the cooling rod in the cryotransfer holder to the outside tube of the holder (heat exchange by gas molecules) the inside 995 of the holder can be pumped by the vacuum 605 of the TEM which is a user-friendly method to maintain the low vacuum during long TEM experiments. In FIG. 9c-9f several solutions for such a closable connection to the TEM vacuum are shown. In FIG. 9c the connection is made by opening a valve 545 (closed in FIG. 9c and open in FIG. 9d). The long connection can be a round tube or can also be a tube with half-moon like shape or something similar, which allows for a larger cross section of the connection, which is preferred for pumping. In FIG. 9e the connection is realised within the outside tube, which is possible with 3D printing In FIG. 9f shows a solution in which the connection between 508 and 605 is much shorter by using an O ring 553 and a movable shutter 555 to the connection 554.

FIG. 10 shows a solution to store in a storage rack 521 multiple cartridges in the holder, including a method to place and remove the cartridges in the storage and to bring a chosen cartridge to the specimen inspection area in the tip of the holder using a cartridge moving ribbon (CMR) 525 that is translated by means of the driver 524 using a profile in the CMR. The cartridge storage rack can have various shapes sus as 521a and 521b. Cartridges are loaded from the tip 511 by pulling with the cartridge moving ribbon 525 until the cartridge is in the cartridge storage rack 521 after which the cartridge moving ribbon is decoupled. Any other cartridge can be coupled to the CMR by shifting the storage rack and coupling the CMR to that cartridge and next pushing the cartridge to the tip 511.

Figure 11:
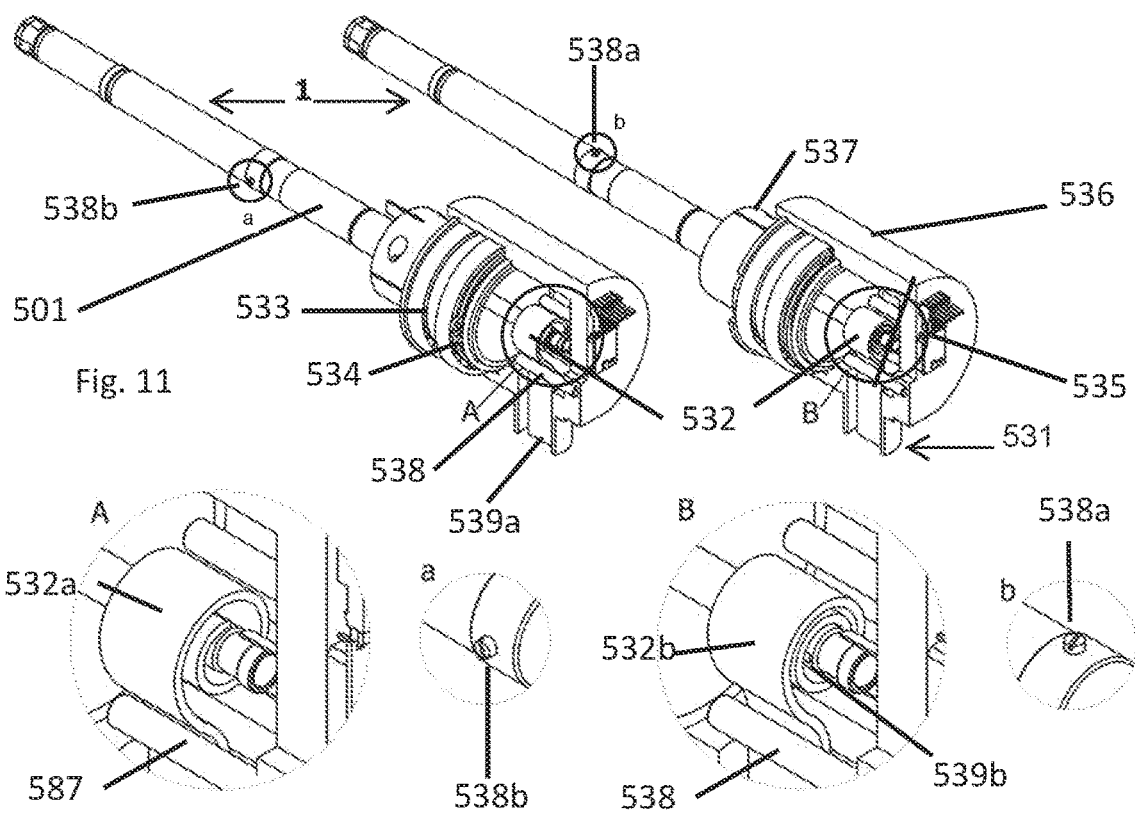

FIG. 11 shows a Cryo+ sample holder that allows for keeping the braid all the time in vertical orientation, also during inserting the holder into the goniometer of the TEM. A sensor 535 measures a deviation from a vertical orientation and by means of software and a motor the holder head is rotated. A high thermal conductivity between the braid in the liquid nitrogen outside the holder and the cooling rod 503 is realised by the use of a coiled flexible ribbon-like Litz wire 532 (like 20 mm wide and 2 mm thick) with is firmly connected at both sides 539a and 539b. The advantage of the coiled configuration is that the rotation requires little force.

What is claimed is:

1. Removable cryotransfer system (1000) for an electron microscope comprising
   at least one cartridge (002) comprising at least one recess (003) for holding a sample carrier, at least one slit (007) providing with respect to the cartridge parallel loading of the sample carrier, the sample carrier being provided on a support, and a fixing element (004),
   a cartridge block (CB) (202) for incorporating the at least one cartridge,
   a cartridge block transporter (CBT) (301) comprising a cartridge block mover (302), and a cartridge block connector (303), a cartridge mover (305), a pushing aid (306), a fastener (307), and a vacuum coupler (308),
   a cryo vacuum transfer chamber (401) comprising a tube (402) adapted to receive a microscope sample holder (501), a valve (404) arranged to receive the cartridge block transporter (301), and an aligner (413) provided inside tube (402) and arranged for receiving the cartridge block thereon in order to position the cartridge into the tip of a microscope sample holder (501), a cooling element connected to the aligner (413) in operation in thermal contact with a cooling liquid (416) to keep the aligner at a temperature of <100K,
   the microscope sample holder (501) with a tip (511) a cooling rod (503), a cooling element (507) in operation adapted to maintain the sample in thermal contact with the cooling rod (503) and the tip (511) to keep the sample at a temperature of <100K.

2. Removable cryotransfer system (1000) according to claim 1, wherein the cartridge (002) comprises at least one of a clamping means (010) for clamping the cartridge in the cartridge block, and a grip (008).

3. Removable cryotransfer system (1000) according to claim 1, wherein the cartridge (002) comprises an array of n*m recesses, wherein n∈[2-10] and m∈[1-10].

4. Removable cryotransfer system (1000) according to claim 1, wherein the recess (003) has a shape selected from circular, ellipsoidal, hexagonal, square, and rectangular.

5. Removable cryotransfer system (1000) according to claim 1, wherein the fixing element (004) is a spring or a clasp (012).

6. Removable cryotransfer system (1000) according to claim 1, wherein the cartridge block (202) comprises at least one of a sample carrier receiving slit (203), a press (204), and a cartridge receiving slit (205).

7. Removable cryotransfer system (1000) according to claim 1, wherein the cartridge (002) has an external shape adapted to an internal shape of the receiving docking.

8. Removable cryotransfer system (1000) according to claim 1, wherein the CBT comprises a click-on element (303).

9. Removable cryotransfer system (1000) according to claim 1, wherein the CBT (301) comprises at least one fixing element (307).

10. Removable cryotransfer system (1000) according to claim 1, wherein the CB (202) comprises at least one alignment element.

11. Removable cryotransfer system (1000) according to claim 1, wherein the aligner (413) comprises at least one of a cartridge-guiding element, a cartridge-aligning element, and 2-10 positioners.

12. Removable cryotransfer system (1000) according to claim 1, wherein the aligner is fixed to the cooling element of the cryo vacuum transfer chamber.

13. Removable cryotransfer system (1000) according to claim 1, wherein the holder (501) comprises a vacuum system, the vacuum system comprising an opening (541), a connection (542,551,552), a space (543), a wall (544) with an opening, a movable stop (545), a slider (546) for moving the stop, an O-ring (547), and a further opening (543) connecting an interior of the holder (508) with space (543).

14. Removable cryotransfer system (1000) according to claim 1, wherein the holder (501) comprises a cartridge storage rack (521), and at least one of a cartridge storage rack mover (522), a guider (523), a translator driver (524), a translator (525) for moving the cartridge in a longitudinal direction, and a housing (527) for the translator.

15. Microscope comprising at least one of a cryo transfer system according to claim 1, a cartridge comprising at least one recess (003) for holding a sample carrier, at least one slit (007) providing with respect to the cartridge parallel loading of the sample carrier, and a fixing element (004), a cartridge block transporter comprising a cartridge block mover (302), and a cartridge block connector (303), a cryo vacuum transfer chamber comprising a tube (402) adapted to receive a microscope sample holder (501), a valve (404) arranged to receive the cartridge block transporter (301), and an aligner (413) provided inside tube (402) and arranged for receiving the cartridge block thereon in order to position the cartridge into the tip of the microscope sample holder (501), a cooling element connected to the aligner (413) in operation in thermal contact with a cooling liquid (416) to keep the aligner at a temperature of <100K, a tube (412), a vacuum tight connector (414), and a metal braid (415), a cartridge block comprising at least one of a sample carrier receiving slit (203), a press (204), an aligning component, and a cartridge receiving slit (205), and a microscope sample holder comprising a tip (511) a cooling rod (503), a cooling element (507) in operation adapted to maintain the sample in thermal contact with the cooling rod (503) and the tip (511) to keep the sample at a temperature of <100K.

* * * * *